US010418484B1

(12) United States Patent
Xie et al.

(10) Patent No.: US 10,418,484 B1
(45) Date of Patent: Sep. 17, 2019

(54) VERTICAL FIELD EFFECT TRANSISTORS INCORPORATING U-SHAPED SEMICONDUCTOR BODIES AND METHODS

(71) Applicant: GLOBALFOUNDRIES INC., Grand Cayman (KY)

(72) Inventors: Ruilong Xie, Schenectady, NY (US); Lars Liebmann, Mechanicville, NY (US); Edward J. Nowak, Shelburne, VT (US); Julien Frougier, Albany, NY (US); Jia Zeng, Sunnyvale, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/920,748

(22) Filed: Mar. 14, 2018

(51) Int. Cl.
*H01L 29/78* (2006.01)
*H01L 21/8238* (2006.01)
(Continued)

(52) U.S. Cl.
CPC .... *H01L 29/7827* (2013.01); *H01L 21/02107* (2013.01); *H01L 21/02126* (2013.01);
(Continued)

(58) Field of Classification Search
CPC . H01L 27/0207; H01L 27/085; H01L 27/092; H01L 27/11273; H01L 27/11556; H01L 27/11582; H01L 27/2454; H01L 29/41741; H01L 29/66272; H01L 29/66666; H01L 29/732; H01L 29/7371;
(Continued)

(56) References Cited

U.S. PATENT DOCUMENTS 7,476,932 B2    1/2009 Zhang et al.
8,405,151 B2 *  3/2013 Kim ..................... H01L 27/0255
                                       257/355
(Continued)

OTHER PUBLICATIONS

Wan et al., "A Feedback Silicon-On-Insulator Steep Switching Device with Gate-Controlled Carrier Injection," Solid-State Electronics, vol. 76, 2012, pp. 109-111.

(Continued)

*Primary Examiner* — Eduardo A Rodela
(74) *Attorney, Agent, or Firm* — Gibb & Riley, LLC; Anthony J. Canale

(57) ABSTRACT

Disclosed is a semiconductor structure that includes a vertical field effect transistor (VFET) with a U-shaped semiconductor body. The semiconductor structure can be a standard VFET or a feedback VFET. In either case, the VFET includes a lower source/drain region, a semiconductor body on the lower source/drain region, and an upper source/drain region on the top of the semiconductor body. Rather than having an elongated fin shape, the semiconductor body folds back on itself in the Z direction so as to be essentially U-shaped (as viewed from above). Using a U-shaped semiconductor body reduces the dimension of the VFET in the Z direction without reducing the end-to-end length of the semiconductor body. Thus, VFET cell height can be reduced without reducing device drive current or violating critical design rules. Also disclosed is a method of forming a semiconductor structure that includes such a VFET with a U-shaped semiconductor body.

20 Claims, 37 Drawing Sheets

(51) Int. Cl.
*H01L 27/092* (2006.01)
*H01L 29/08* (2006.01)
*H01L 29/10* (2006.01)
*H01L 29/423* (2006.01)
*H01L 21/02* (2006.01)
*H01L 21/311* (2006.01)
*H01L 21/3105* (2006.01)
*H01L 21/8234* (2006.01)
*H01L 21/822* (2006.01)
*H01L 21/8232* (2006.01)
*H01L 27/112* (2006.01)
*H01L 27/24* (2006.01)
*H01L 29/66* (2006.01)
*H01L 27/11582* (2017.01)
*H01L 27/11556* (2017.01)
*H01L 29/786* (2006.01)

(52) U.S. Cl.
CPC .. *H01L 21/02164* (2013.01); *H01L 21/02211* (2013.01); *H01L 21/02639* (2013.01); *H01L 21/31055* (2013.01); *H01L 21/31111* (2013.01); *H01L 21/8221* (2013.01); *H01L 21/8232* (2013.01); *H01L 21/823487* (2013.01); *H01L 21/823807* (2013.01); *H01L 21/823814* (2013.01); *H01L 21/823828* (2013.01); *H01L 21/823885* (2013.01); *H01L 27/092* (2013.01); *H01L 27/11273* (2013.01); *H01L 27/11556* (2013.01); *H01L 27/11582* (2013.01); *H01L 27/2454* (2013.01); *H01L 29/0847* (2013.01); *H01L 29/1037* (2013.01); *H01L 29/4238* (2013.01); *H01L 29/66666* (2013.01); *H01L 29/78642* (2013.01)

(58) Field of Classification Search
CPC ............. H01L 29/7788; H01L 29/7827; H01L 29/78642; H01L 29/7889; H01L 29/7926; H01L 51/057; H01L 2924/13087
See application file for complete search history.

(56) References Cited

U.S. PATENT DOCUMENTS

| | | | |
|---|---|---|---|
| 9,087,897 | B1 | 7/2015 | Anderson et al. |
| 9,299,835 | B1* | 3/2016 | Anderson ........... H01L 29/7827 |
| 9,614,067 | B2 | 4/2017 | Kim et al. |
| 9,716,170 | B1* | 7/2017 | Cheng ................ H01L 29/7827 |
| 9,786,662 | B1 | 10/2017 | Lin et al. |
| 9,799,570 | B1* | 10/2017 | Cheng ............ H01L 21/823878 |
| 9,837,405 | B1* | 12/2017 | Cheng ................ H01L 27/0886 |
| 9,847,416 | B1 | 12/2017 | Nowak et al. |
| 9,876,015 | B1* | 1/2018 | Balakrishnan ........ H01L 27/092 |
| 10,069,008 | B1* | 9/2018 | Balakrishnan ...... H01L 29/7827 |
| 2009/0200604 | A1* | 8/2009 | Chidambarrao .. H01L 29/66787 257/329 |
| 2016/0063163 | A1* | 3/2016 | Moroz ................ H01L 29/0676 716/110 |
| 2016/0086970 | A1* | 3/2016 | Peng ................ H01L 27/11565 257/324 |
| 2017/0301590 | A1* | 10/2017 | Anderson ........... H01L 27/0617 |
| 2017/0373062 | A1* | 12/2017 | Yang .................. H01L 27/0924 |
| 2018/0040740 | A1* | 2/2018 | Cantoro .......... H01L 21/823807 |
| 2018/0254218 | A1* | 9/2018 | Cheng ............ H01L 21/823462 |

OTHER PUBLICATIONS

Jeon et al., "Steep Subthreshold Swing n- and p-Channel Operation of Bendable Feedback Field-Effect Transistors with p+-i-n+ Nanowires by Dual-Top-Gate Voltage Modulation," American Chemical Society, Nano Letters, 2015, 15, pp. 4905-4913.

* cited by examiner

VERTICAL FIELD EFFECT TRANSISTORS INCORPORATING U-SHAPED SEMICONDUCTOR BODIES AND METHODS

BACKGROUND

Field of the Invention

The present invention relates to vertical field effect transistors (VFETs) and, more particularly, to VFET structures and methods that enable cell height scaling.

Description of Related Art

Integrated circuit (IC) design decisions are often driven by device scalability. For example, size scaling of planar field effect transistors (FETs) resulted in the development of planar FETs with relatively short channel lengths. Unfortunately, the smaller channel lengths resulted in a corresponding increase in short channel effects. In response, a fin-type FET (FINFET) was developed. A fin-type FET (FINFET) is a non-planar FET that incorporates a fin-shaped semiconductor body and, within the fin-shaped semiconductor fin, a channel region positioned laterally between source/drain regions (e.g., oriented along the X direction). A gate is positioned adjacent to the opposing sidewalls of the fin-shaped semiconductor body at the channel region and the channel width corresponds to the height of the fin-shaped semiconductor body (e.g., in the Y direction). Such a FIN-FET exhibits two-dimensional field effects as compared to the single-dimensional field effects exhibited by a planar FET and, thus, exhibits improved gate control over the channel region. It should be noted that, because the fin-shaped semiconductor body of the FINFET is so thin, any field effects exhibited at the top surface are insignificant (i.e., negligible).

Recently, a vertical FET (VFET) was developed to provide an increase in device density (i.e., an increase in the number of devices within a given chip area) over that achievable with FINFETs. A VFET similarly incorporates a fin-shaped semiconductor body. However, the VFET components are stacked vertically on a substrate (e.g., along the Y direction) as opposed to being positioned side by side across a substrate (e.g., along X direction). Specifically, a VFET typically includes a lower source/drain region in a substrate, a semiconductor fin that extends upward from the lower source/drain region, and an upper source/drain region that is epitaxially grown on the top surface of the semiconductor fin. A gate (e.g., a metal gate) laterally surrounds the fin-shaped semiconductor body (which functions as the channel region) and the channel width corresponds to the length of the fin-shaped semiconductor body (e.g., along the Z direction). The gate is electrically isolated from the lower source/drain region and the upper source/drain region by lower and upper spacer layers, respectively.

Integrated circuit (IC) design decisions are also driven by cell scalability. Specifically, a cell (also referred to as a library element) represents a set of devices with specific features and the interconnect structure(s) that connect those devices. Such cells can include, for example, memory cells, library cells, etc. The conventional design for a cell that incorporates a set of VFETs typically includes two rows of parallel fin-shaped semiconductor bodies with adjacent semiconductor fins in different rows being in end-to-end alignment along the Z direction. Since the channel width of a VFET corresponds to the length of its fin-shaped semiconductor body, the fin-shaped semiconductor bodies must be sufficiently long to achieve the desired device drive current. As a result, VFET cell size scaling and, particularly, VFET cell height scaling as measured in the Z direction is limited. Additional limitations on VFET cell size scaling include, but are not limited to, critical design rules (e.g., minimum gate contact to fin distance, etc.).

SUMMARY

In view of the foregoing, disclosed herein are embodiments of a semiconductor structure that includes a vertical field effect transistor (VFET) with a U-shaped semiconductor body to facilitate VFET cell height scaling without the corresponding impact on device performance (e.g., without reduced device drive current) and without design rule violations. Specifically, the semiconductor structure can include a standard VFET or a feedback VFET. In either case, the VFET can include a lower source/drain region, a semiconductor body on the lower source/drain region, and an upper source/drain region on top of the semiconductor body. The semiconductor body does not, however, have an elongated fin shape. Instead, the semiconductor body folds back on itself in the Z direction so as to be essentially U-shaped (as viewed from above). Using a U-shaped semiconductor body reduces the dimension of the VFET in the Z direction without reducing the end-to-end length of the semiconductor body. As a result, VFET cell height as measured in the Z direction can be reduced without reducing device drive current or violating critical design rules. Also disclosed herein are embodiments of a method of forming a semiconductor structure that includes such a VFET.

More particularly, disclosed herein are embodiments of a semiconductor structure. In each of the embodiments, the semiconductor structure can include a substrate and, on the substrate, at least one vertical field effect transistor (VFET) with a U-shaped semiconductor body. Specifically, in each of the embodiments, the VFET can include a lower source/drain region on the substrate. The VFET can further include a semiconductor body on the lower source/drain region. The semiconductor body can have three segments and, particularly, two parallel segments and a connecting segment that extends laterally between adjacent ends of the two parallel segments. The heights of the three segments can be essentially the same. Thus, the semiconductor body is essentially U-shaped (as viewed from above). The VFET can further include an upper source/drain region on the top of the semiconductor body.

In one embodiment, the VFET can be a standard VFET where lower source/drain region and the upper source/drain region have the same type conductivity. Such a standard VFET can further include a gate structure that laterally surrounds the semiconductor body and is electrically isolated from the lower source/drain region by a lower spacer and from the upper source/drain region by an upper spacer. The standard VFET can also include a gate contact, which extends vertically between the parallel segments of the semiconductor body and which has vertical surfaces that are in contact with vertical surfaces the gate structure. Alternatively, the standard VFET can include a gate extension that is in contact with the gate structure and a gate extension contact on the gate extension.

In another embodiment, the VFET can be a feedback VFET where the lower source/drain region and the upper source/drain region have different type conductivities. Such a feedback VFET can further include a first gate structure that laterally surrounds a lower portion of the semiconductor body and a second gate structure that laterally surrounds an upper portion of the semiconductor body. A lower spacer can electrically isolate the first gate structure from the lower source/drain region. A middle spacer can electrically isolated the first gate structure from the second gate structure. An upper spacer can electrically isolate the second gate structure from the upper source/drain region. The feedback VFET can also include a gate extension that is in contact with the first gate structure, a gate extension contact on the gate extension, and a gate contact, which extends vertically between the parallel segments of the semiconductor body, which lands on interlayer dielectric material at some level above the middle spacer, and which has vertical surfaces that are in contact with vertical surfaces of the second gate structure.

Also disclosed herein are method embodiments for forming the above-mentioned semiconductor structure embodiments. Generally, the method embodiments include providing a semiconductor substrate and forming one or more vertical field effect transistors (VFET) on the semiconductor substrate such that each VFET includes an essentially U-shaped semiconductor body. That is, the semiconductor body has three segments with essentially equal heights including two parallel segments and a connecting segment that extends laterally between adjacent ends of the two parallel segments. Thus, the semiconductor body is essentially U-shaped (as viewed from above) with a closed end (i.e., the base of the U-shape defined by the connecting segment) and an open end opposite the closed end.

One embodiment of the method includes forming one or more standard VFETs on the substrate. This embodiment includes providing a semiconductor substrate and forming, on the substrate, the essentially U-shaped semiconductor body, as discussed above. Subsequently, a lower source/drain region can be formed in the substrate adjacent to the bottom of the semiconductor body. A lower spacer can be formed on the lower source/drain region such that it laterally surrounds a bottom end of the semiconductor body. A gate formation process can be performed to form a gate structure on the lower spacer such that it laterally surrounds the semiconductor body and so that it is electrically isolated from the lower source/drain region by the lower spacer. An upper spacer can be formed on the gate structure such that it laterally surrounds a top end of the semiconductor body. An upper source/drain region can be formed on the top of the semiconductor body and, particularly, on the tops of the three segments of the semiconductor body such that it is electrically isolated from the gate structure by the upper spacer, such that it has the same type conductivity as the lower source/drain region, and further such that it is also essentially U-shaped. In this embodiment, a gate contact can be formed such that it extends between the parallel segments of the semiconductor body, lands on the lower spacer, and has vertical surfaces that are in contact with vertical surfaces the gate structure. Alternatively, during the gate formation process, a gate extension can also be formed such that it contacts the gate structure. Then, a gate extension contact can be formed such that it lands on the gate extension.

Another embodiment of the method includes forming one or more feedback VFET on the substrate. This embodiment includes providing a semiconductor substrate and forming a lower source/drain region on the substrate such that it has a first-type conductivity. Subsequently, a semiconductor body can be formed on the lower source/drain region such that the semiconductor body is essentially U-shaped, as discussed above. An upper source/drain region can be formed on the top of the semiconductor body and, particularly, on the tops of the three segments of the semiconductor body such that it has a second type conductivity (which is different further the first-type conductivity of the lower source/drain region) and further such that it is also essentially U-shaped. Multiple spacers can also be formed including: a lower spacer above the lower source/drain region and laterally surrounding a bottom end of the semiconductor body; a middle spacer laterally surrounding a center portion of the semiconductor body at an interface between a lower portion and an upper portion; and an upper spacer laterally surrounding a top end of the semiconductor body. A gate formation process can then be performed in order to form: a first gate structure that laterally surrounds the lower portion of the semiconductor body between the lower spacer and the middle spacer; a second gate structure that laterally surrounds the upper portion of the semiconductor body between the middle spacer and the upper spacer; and a gate extension that contacts the first gate structure adjacent to the open end of the semiconductor body. In this case, the first gate structure is electrically isolated from the lower source/drain region by the lower spacer and electrically isolated from the second gate structure by the middle spacer. Additionally, the second gate structure is electrically isolated from the upper source/drain region by the upper spacer. In this embodiment, a gate extension contact can be formed such that it lands on the gate extension and is thereby electrically connected to the first gate structure. Additionally, a gate contact can be formed such that it extends between the parallel segments of the semiconductor body, lands on interlayer dielectric material above the level of the middle spacer and has vertical surfaces that are in contact with vertical surfaces the second gate structure.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1A:
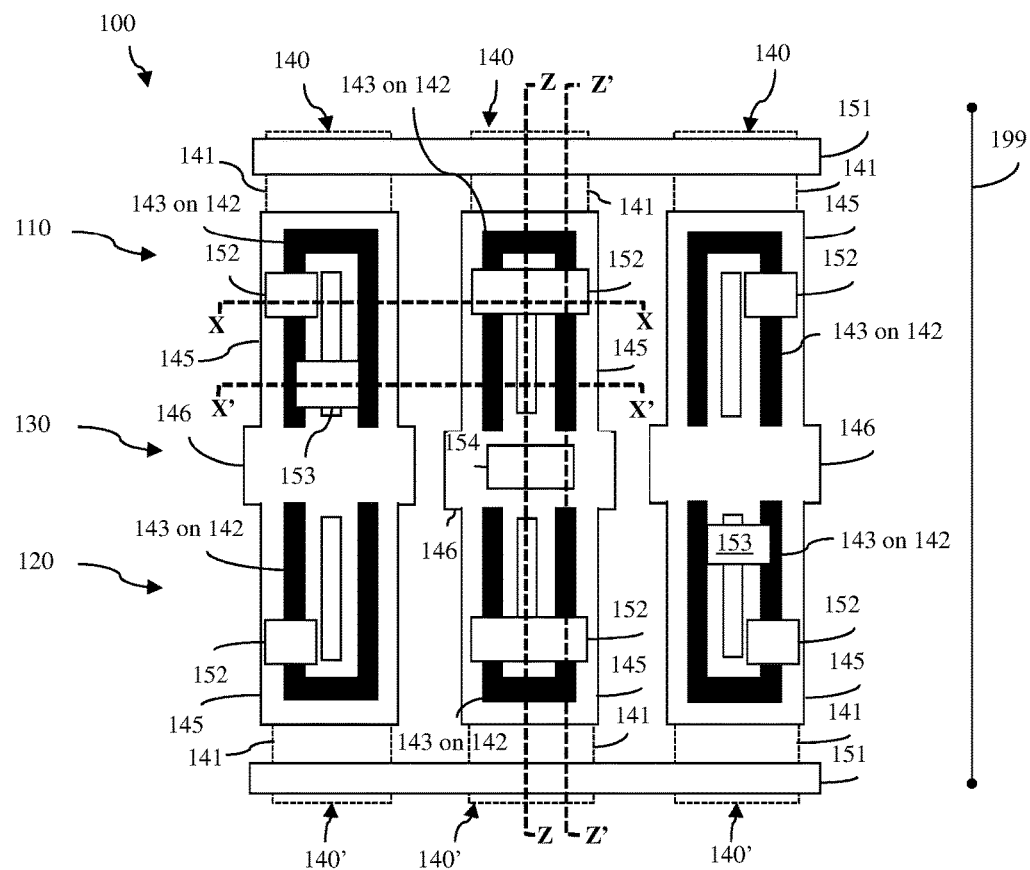
FIG. 1A is a layout diagram of an embodiment of an semiconductor structure.
Figure 1B:
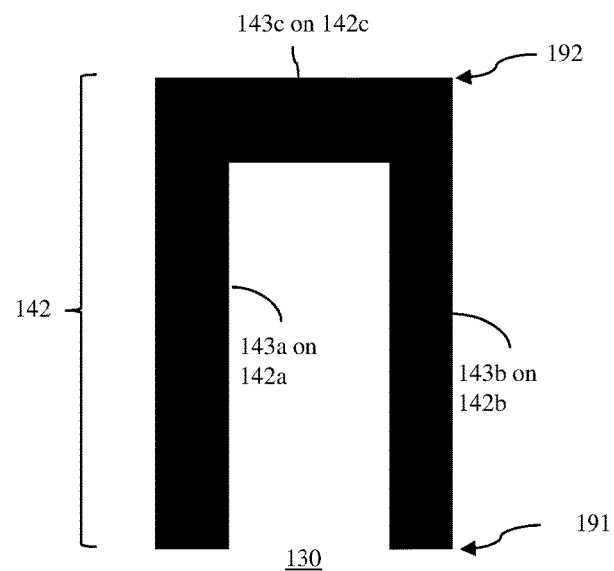
FIG. 1B is a top view diagram of an exemplary U-shaped semiconductor body in the semiconductor structure of FIG. 1A and FIGS. 1C-1F are different cross-section diagrams of portions of the semiconductor structure of FIG. 1A.
Figure 1C:
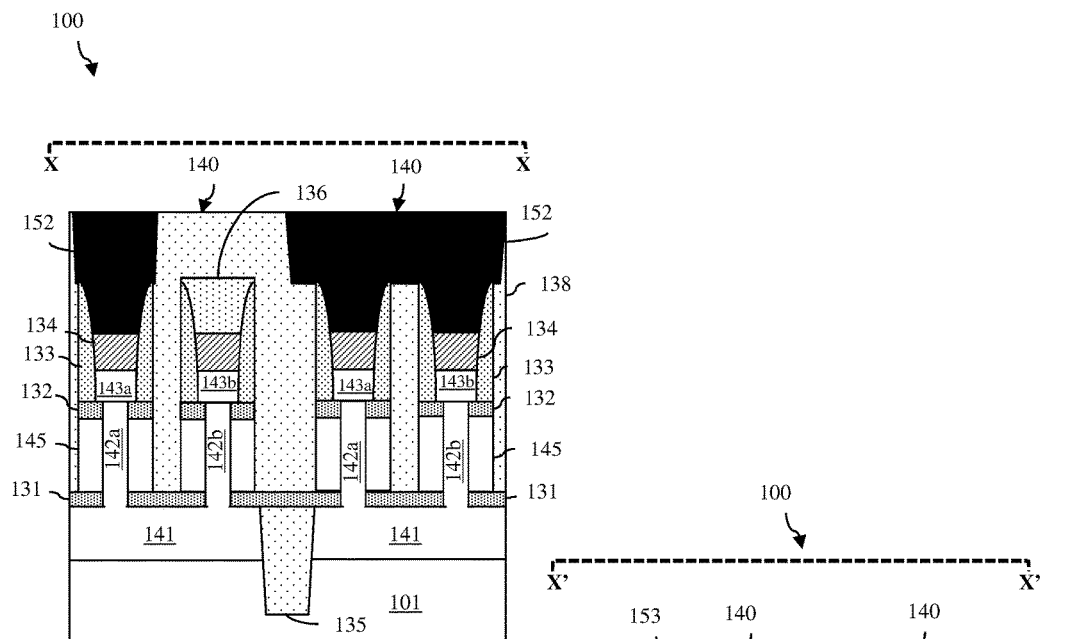
Figure 1D:
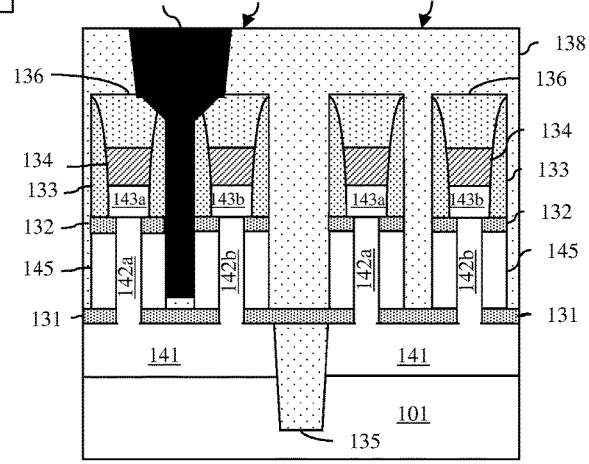
Figure 1E:
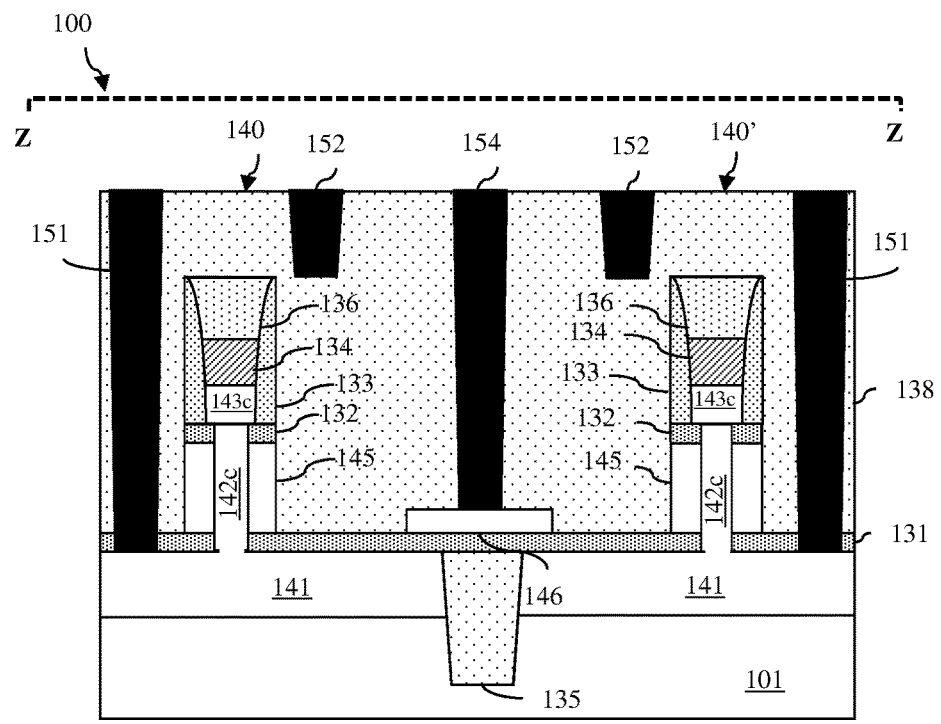
Figure 1F:
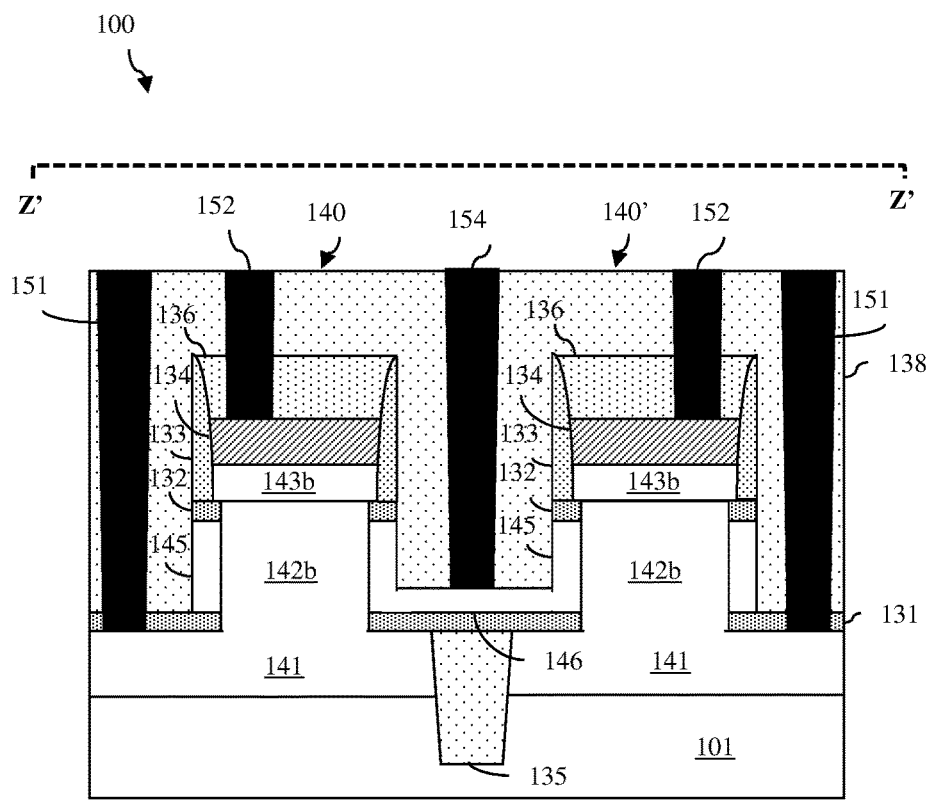

As mentioned above, the conventional design for a cell that incorporates a set of vertical field effect transistors (VFETs) typically includes two rows of parallel fin-shaped semiconductor bodies with adjacent semiconductor fins in different rows being in end-to-end alignment along the Z direction. Since the channel width of a VFET corresponds to the length of its fin-shaped semiconductor body, the fin-shaped semiconductor bodies must be sufficiently long to achieve the desired device drive current. As a result, VFET cell size scaling and, particularly, VFET cell height scaling as measured in the Z direction is limited. Additional limitations on VFET cell size scaling include, but are not limited to, critical design rules (e.g., minimum gate contact to fin distance, etc.).

In view of the foregoing, disclosed herein are embodiments of a semiconductor structure that includes a vertical field effect transistor (VFET) with a U-shaped semiconductor body to facilitate VFET cell height scaling without the corresponding impact on device performance (e.g., without reduced device drive current) and without design rule violations. Specifically, the semiconductor structure can include a standard VFET or a feedback VFET. In either case, the VFET can include a lower source/drain region, a semiconductor body on the lower source/drain region, and an upper source/drain region on top of the semiconductor body. The semiconductor body does not, however, have an elongated fin shape. Instead, the semiconductor body folds back on itself in the Z direction so as to be essentially U-shaped (as viewed from above). Using a U-shaped semiconductor body reduces the dimension of the VFET in the Z direction without reducing the end-to-end length of the semiconductor body. As a result, VFET cell height as measured in the Z direction can be reduced without reducing device drive current or violating critical design rules. Also disclosed herein are embodiments of a method of forming a semiconductor structure that includes such a VFET.

More particularly, disclosed herein are embodiments of semiconductor structure 100, 200 (see FIGS. 1A-1F and FIGS. 2A-2F, respectively). The semiconductor structure 100, 200 can include a substrate 101, 201. The substrate 101, 201 can be a bulk semiconductor substrate (e.g., a bulk silicon substrate), as illustrated. Alternatively, the substrate 101, 201 can be a semiconductor layer of a semiconductor-on-insulator structure (e.g., a silicon layer of a silicon-on-insulator (SOI) structure).

The semiconductor structure 100, 200 can further include one or more vertical field effect transistors (VFETs). The VFET(s) can be standard VFET(s) (e.g., the see the standard VFETs 140, 140' in the semiconductor structure 100 of FIGS. 1A-1F). Alternatively, the VFET(s) can be feedback VFET(s) (e.g., see the feedback VFETs 240, 240' in the semiconductor structure 200 of FIGS. 2A-2F).

Those skilled in the art will recognize that a standard VFET refers to a VFET where the lower and upper source/drain regions have the same type conductivity. For example, the lower and upper source/drain regions can have P-type conductivity for a P-type VFET or the lower and upper source/drain regions can have N-type conductivity for an N-type VFET. In this case, a gate structure controls current flow between the lower and upper source/drain regions. A feedback VFET refers to a VFET where the lower and upper source/drain regions have different type conductivities. For example, the lower source/drain region can have N-type conductivity and the upper source/drain region can have P-type conductivity or vice versa. In this case, two discrete and separately biased gate structures control current flow between the lower and upper source/drain regions and, depending upon the voltages used to bias the gates, the feedback VFET will function as either an N-type VFET or a P-type VFET.

Figure 2A:
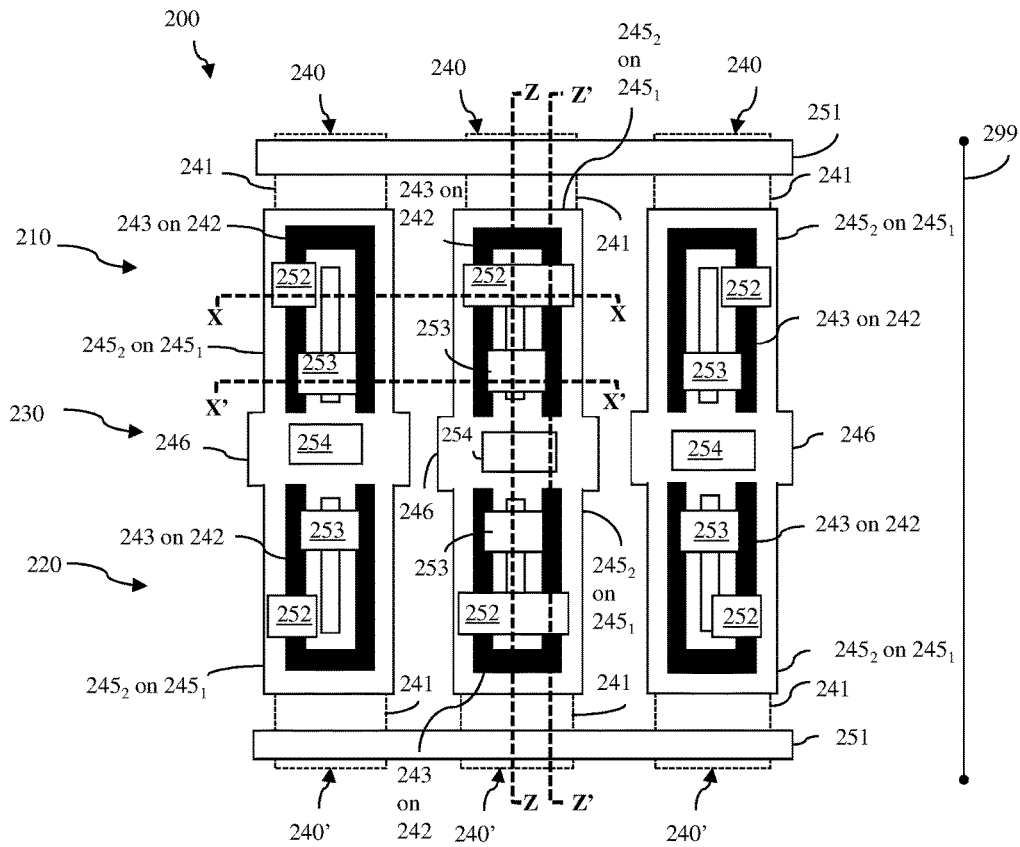
FIG. 2A is a layout diagram of an embodiment of an semiconductor structure.
Figure 2B:
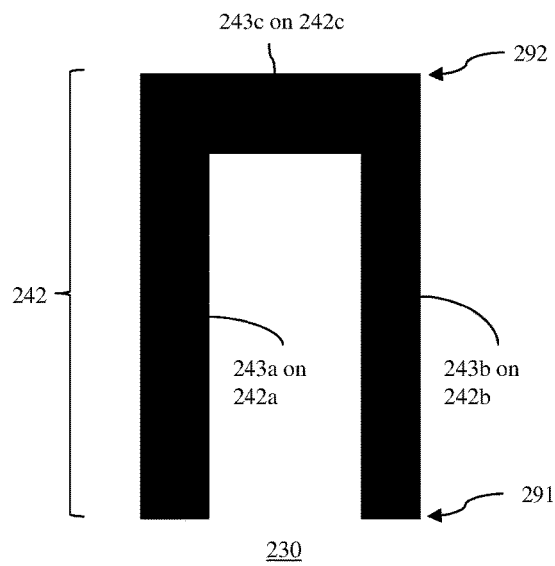
FIG. 2B is a top view diagram of an exemplary U-shaped semiconductor body in the semiconductor structure of FIG. 2A and FIGS. 2C-2F are different cross-section diagrams of portions of the semiconductor structure of FIG. 2A.
Figure 2C:
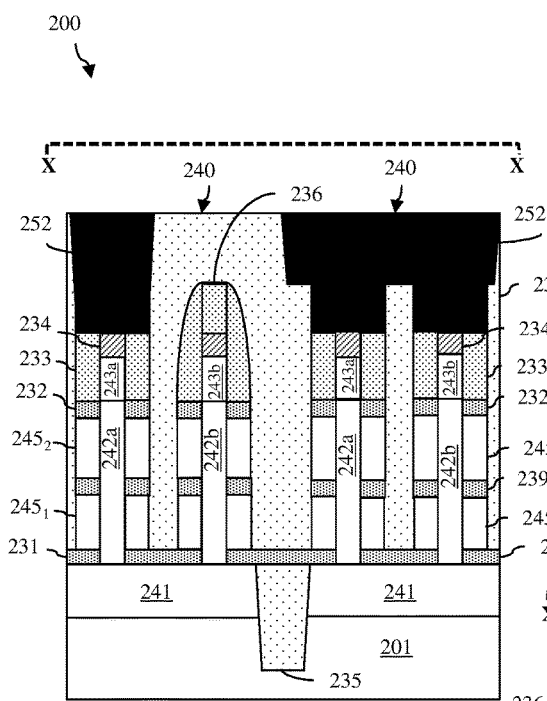
Figure 2D:
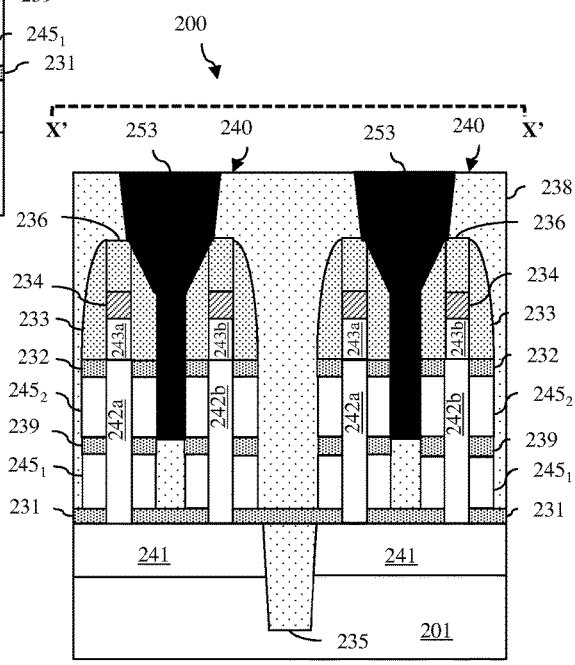
Figure 2E:
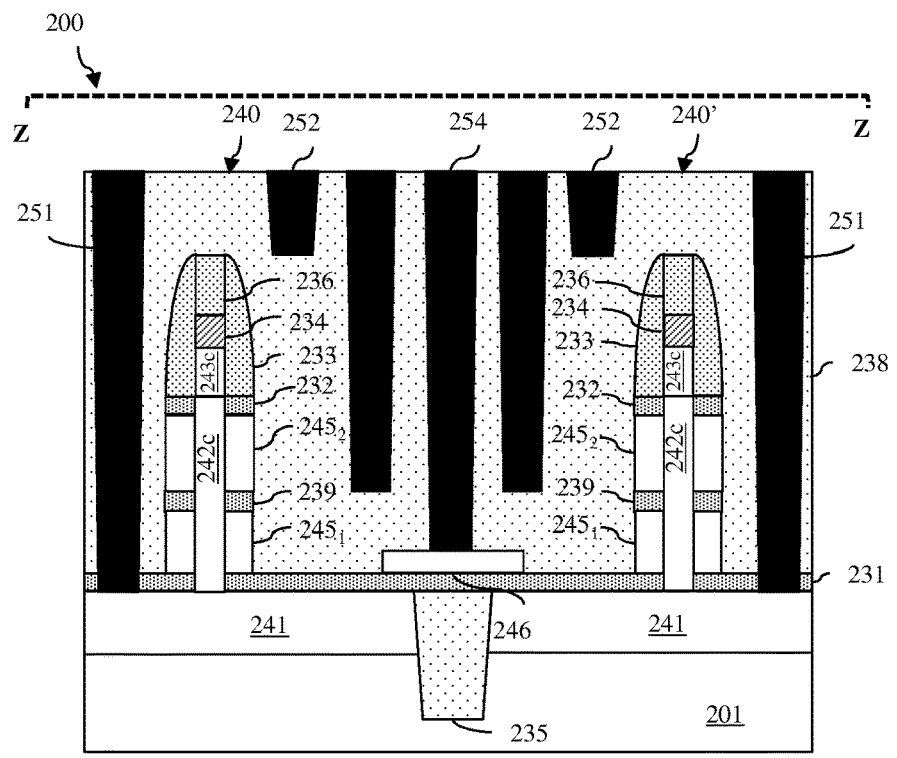
Figure 2F:
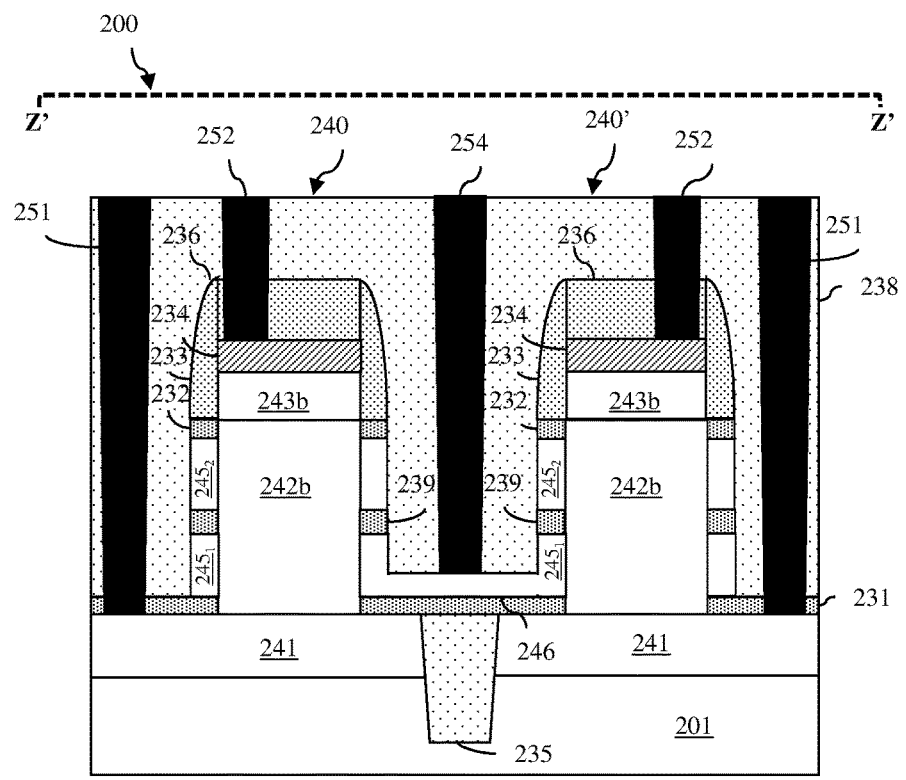

For purposes of illustration, each semiconductor structure 100, 200 is shown in the Figures as including an exemplary VFET cell with multiple VFETs and, particularly, a first row 110, 210 of VFETs 140, 240 and a second row 120, 220 of VFETs 140', 240', wherein the second row 120, 220 is parallel to the first row 110, 210 and is separated from the first row 110, 210 by a space 130, 230. Additionally, it should be noted that in the Figures and mentioned in the detailed description are various directions labeled X (or X'), Y, and Z (or Z'). The X direction is parallel to the bottom surface of the substrate 101, 201 (i.e., is horizontal relative to the substrate). The Y direction is perpendicular to the bottom surface of the substrate 101, 201 (i.e., is vertical relative to the substrate and perpendicular to the X). The Z direction is also parallel to the bottom surface of the substrate 101, 201, but perpendicular to the X direction. The height 199, 299 of a VFET cell refers to a measurement taken in the Z direction across the rows of VFETs, as indicated in FIGS. 1A and 2A.

In any case, each VFET 140/140', 240/240' can include a lower source/drain region 141, 241 on the substrate 101, 201. The lower source/drain region 141, 241 can be a dopant implant region within the substrate 101, 201. Alternatively, the lower source/drain region 141, 241 can be an area of in situ doped, epitaxial, monocrystalline semiconductor material that fills a trench within the substrate 101, 201. For a P-type lower source/drain region, the epitaxial semiconductor material can be silicon or, alternatively, can be silicon germanium or any other suitable semiconductor material that enhances P-type VFET performance. For an N-type lower source/drain region, the epitaxial semiconductor material can be silicon or, alternatively, silicon carbide or any other suitable semiconductor material that enhances N-type VFET performance.

A shallow trench isolation (STI) region 135, 235 in the substrate 101, 201 can define the shape of each lower source/drain regions. In a VFET cell, STI regions 135, 235 can electrically isolate lower source/drain regions of the VFETs 140, 240 in the first row 110, 210 from the lower source/drain regions of the VFETs 140', 240' in the second row 120, 220 and can further electrically isolate each lower source/drain region in a given row from the adjacent lower source/drain regions in the same row.

Each VFET 140/140', 240/240' can further include an essentially U-shaped semiconductor body 142, 242. Specifically, this semiconductor body 142, 242 can be made of a monocrystalline semiconductor material (e.g., monocrystalline silicon). It can extend vertically upward from a top surface of the lower source/drain region 141, 241 and can include three segments 142a-142c, 242a-242c. These three segments 142a-142c, 242a-242c can include two parallel segments 142a-142b, 242a-242b and a connecting segment 142c, 242c, which extends laterally between adjacent ends of the parallel segments 142a-142b, 242a-242b. As illustrated, the parallel segments can be oriented in the Z direction and the connecting segment can be oriented in the X direction. The bottoms of the three segments 142a-142c, 242a-242c can be immediately adjacent to the lower source/drain region 141, 241 and the heights of the three segments 142a-142c, 242a-242c, as measured in the Y direction, can be essentially the same such that the semiconductor body 142, 242 is essentially U-shaped (as viewed from above) with a closed end 192, 292 (i.e., the base of the U-shape defined by the connecting segment) and an open end 191, 291 opposite the closed end 192, 292.

Each VFET 140/140', 240/240' can further include an upper source/drain region 143, 243 on top of the U-shaped semiconductor body 142, 242 and, particularly, on the tops of the three segments 142a-142c, 242a-242c of the U-shaped semiconductor body such that the upper source/drain region 143, 243 is also essentially U-shaped. The upper source/drain region 143, 243 can be in situ doped, epitaxial, monocrystalline semiconductor material that is grown on the top of the U-shaped semiconductor body 142, 242. For a P-type upper source/drain region, the semiconductor material can be silicon or, alternatively, can be silicon germanium or any other suitable semiconductor material that enhances P-type VFET performance. For an N-type upper source/drain region, the semiconductor material can be silicon or, alternatively, silicon carbide or any other suitable semiconductor material that enhances N-type VFET performance.

Each VFET 140/140', 240/240' can further include a metal plug 134, 234 on the top surface of the upper source/drain region 143, 243. The metal plug 134, 234 can include, for example, a metal silicide layer and/or a metal layer. The metal or metal alloy material of the metal plug can be, for example, tungsten, cobalt, aluminum or any other suitable metal plug material.

Each VFET 140/140', 240/240' can further include a dielectric plug cap 136, 236 above the metal plug 134, 234. The dielectric material of the dielectric plug cap 136, 236 can be, for example, silicon nitride or any other suitable dielectric plug cap material.

Each VFET 140/140', 240/240' can further include a dielectric sidewall spacer 133, 233, which laterally surrounds and is immediately adjacent to sidewalls of the upper source/drain region 143, 243 and the metal plug 134, 234. Upper portions of the dielectric sidewall spacer 133, 233 can further laterally surround and be immediately adjacent to sidewalls of the dielectric plug cap 136, 236. The dielectric material of the dielectric sidewall spacer 133, 233 can be a different material than that used for the dielectric plug cap (e.g., see the method embodiment discussed below for forming the semiconductor structure 100) or, alternatively, can be the same dielectric materials as that used for the dielectric plug cap (e.g., see the method embodiment discussed below for forming the semiconductor structure 200).

Referring specifically to the semiconductor structure 100 shown in FIGS. 1A-1F, each VFET can be a standard VFET 140, 140' where the lower source/drain region 141 and the upper source/drain region 143 have the same type conductivity. For example, the lower and upper source/drain regions can have P-type conductivity for a P-type VFET or the lower and upper source/drain regions can have N-type conductivity for an N-type VFET.

Each standard VFET 140, 140' can further include a gate structure 145 that laterally surrounds the U-shaped semiconductor body 142 and defines a channel region that extends vertically from the lower source/drain region 141 to the upper source/drain region 143. The gate structure 145 can include a gate dielectric layer (e.g., a high K gate dielectric layer or any other suitable gate dielectric layer) immediately adjacent to the vertical sidewalls of each segment 142a-142c of the U-shaped semiconductor body 142 and a gate conductor layer positioned laterally immediately adjacent to the gate dielectric layer opposite the vertical sidewalls of each segment 142a-142c of the U-shaped semiconductor body 142.

Each standard VFET 140, 140' can further include a lower spacer 131, which electrically isolates the gate structure 145 from the lower source/drain region 141, and an upper spacer 132, which electrically isolates the gate structure 145 from the upper source/drain region 143. The lower spacer 131 can be above the lower source/drain region 141 and can laterally surround a bottom end of the U-shaped semiconductor body 142. The gate structure 145 can be above the lower spacer 131. The upper spacer 132 can be above the gate structure 145 and can laterally surround a top end of the U-shaped semiconductor body 142. The dielectric sidewall spacer 133, discussed above, can be above and immediately adjacent to the upper spacer 132 and can laterally surround the upper source/drain region 143. The lower and upper spacers 131-132 can be made of relatively thin layers of dielectric spacer material (e.g., hydrogenated silicon oxycarbide, silicon boron carbon nitride, silicon oxynitride or any other suitable dielectric spacer material). It should be noted that, as illustrated, outer sidewalls of the dielectric sidewall spacer 133, the upper spacer 132 and the gate structure 145 can be essentially vertically aligned and the lower spacer 131 can extend laterally beyond those outer sidewalls (e.g., over the STI regions 135).

Each standard VFET 140, 140' can further be covered by one or more layers of interlayer dielectric (ILD) material 138. For example, ILD material 138 can be above each standard VFET, on the top surface of the lower spacer 131 between each standard VFET, and positioned laterally immediately adjacent to vertical surfaces of the gate structure 145, upper spacer 132, and dielectric sidewall spacer 133 both inside and outside the U-shaped semiconductor body. The ILD material 138 can be silicon dioxide or any other suitable ILD material.

Each standard VFET 140, 140' can further include contacts that extend through the ILD material 138 to the various VFET nodes. The contacts can include a lower source/drain contact 151. This lower source/drain contact 151 can be located adjacent to the closed end 192 of the U-shaped semiconductor body 142 and can extend vertically through the ILD material 138 to an edge portion of the lower source/drain region 141, which extends laterally beyond the closed end 192 of the U-shaped semiconductor body 142 (see FIGS. 1A, 1E and 1F). These contacts can further include an upper source/drain contact 152 that extends vertically through the ILD material 138 and the dielectric plug cap 136 so as to land on the metal plug 134. The upper source/drain contact 152 can further be aligned so that it is above at least one segment 142a-142c of the U-shaped semiconductor body 142. For example, a given standard VFET 140, 140' could have an upper source/drain contact 152 that is aligned above only one segment of the U-shaped semiconductor body (e.g., see the upper source/drain contact 152 that is aligned above only segment 142a in the VFETs 140, 140' on the left side of the cell shown in FIG. 1A; see also the upper source/drain contact 152 that is aligned above only segment 142b in the VFETs 140, 140' on the right side of the cell shown in FIG. 1A) or above multiple segments of the U-shaped semiconductor body (e.g., see the upper source/drain contact 152 that is aligned above both parallel segments 142a and 142b in the VFETs 140, 140' at the center of the cell shown in FIG. 1A). These contacts can further include a gate contact 153, which extends vertically between the parallel segments 142a-142b of the U-shaped semiconductor body (e.g., near the open end 191) and which lands on the lower spacer 131. Such a gate contact 153 can have opposing vertical surfaces that are in contact with vertical surfaces of the portions of the gate structure 145 on the parallel segments of the U-shaped semiconductor body, respectively. Such a gate contact 153 can be electrically isolated from the lower source/drain region by the lower spacer 131 and from the upper source/drain region 143 by the dielectric plug cap 136 and the dielectric sidewall spacer 133. Alternatively, the standard VFET 140, 140' can further include a gate extension 146, which is in contact with the gate structure 145, and a gate extension contact 154, which extends vertically through the ILD material 138 and lands on a horizontal surface of the gate extension 146. As discussed in greater detail below with regard to the method embodiments, this gate extension 146 can be formed during gate formation and, thus, can be made of the same materials as the gate structure 145.

It should be noted that in the exemplary VFET cell shown in FIGS. 1A-1F, the standard VFETs 140 in the first row 110 can be P-type VFETs with P-type lower and upper source/drain regions 141/143 and the standard VFETs 140' in the second row 120 can be N-type VFET with N-type lower and upper source/drain regions 141/143. The open ends 191 of all the U-shaped semiconductor bodies of all the standard VFETs 140, 140' can be adjacent to the space 130 between the rows 110 and 120 such that the closed ends 192 of the U-shaped semiconductor bodies 142 of the standard VFETs 140 in the first row 110 are at the top of the cell and the closed ends 192 of the U-shaped semiconductor bodies 142 of the standard VFETs 140' in the second row 120 are at the bottom of the cell. Furthermore, the parallel segments of pairs of U-shaped semiconductor bodies on opposite sides of the space 130 can be aligned.

In such a VFET cell, contact placement can optimized to both avoid critical design rule violations and allow for cell size scaling. For example, because each upper source/drain region 143 is also essentially U-shaped, the upper source/drain contacts 152 to the upper source/drain regions 143 of standard VFETs in the same row can land on adjacent upper source/drain regions and still be separated by a sufficient distance to avoid shorting and/or coupling issues. For example, upper source/drain contact placement can be such that upper source/drain contacts contact each upper source/drain region but no two upper source/drain contacts contact adjacent parallel segments of different U-shaped semiconductor bodies in the same row. Additionally, the gate contacts 153 and gate extension contacts 154 can be staggered to avoid shorting and/or coupling issues. For example, the same gate extension 146 can be in contact with the gate structures 145 of each pair of standard VFETs 140 and 140' on located on opposite sides of the space 130. For one pair of standard VFETs 140 and 140', a single gate contact 153 can extend vertically between the parallel segments 142a-142b of the U-shaped semiconductor body to the gate structure 145 of the standard VFET 140 in the first row 110 only (see the gate contact to the standard VFET in the first row on the left side of cell). For another pair of standard VFETs 140 and 140', a single gate extension contact 154 can extend vertically to the gate extension 146 that is in contact with the gate structures of both VFETs in the pair (see the gate extension contact to the gate extension at the center of the cell). For yet another pair of standard VFETs 140 and 140', a single gate contact 153 can extend vertically between the parallel segments 142a-142b of the U-shaped semiconductor body to the gate structure 145 of the standard VFET 140' in the second row 120 only (see the gate contact to the standard VFET in the second row on the right side of cell).

Referring specifically to the semiconductor structure 200 shown in FIGS. 2A-2F, each VFET can be a feedback VFET 240, 240', where the lower source/drain region 241 and the upper source/drain region 243 have different type conductivities. For example, the lower source/drain region 241 can have N-type conductivity and the upper source/drain region 243 can have P-type conductivity or vice versa.

Each feedback VFET 240, 240' can further include multiple gate structures. Specifically, each feedback VFET 240, 240' can include a first gate structure $245_1$ that laterally surrounds a lower portion of the U-shaped semiconductor body 242 so as to define a first channel region therein and a second gate structure $245_2$ that laterally surround an upper portion of the U-shaped semiconductor body 242 above the lower portion so as to define a second channel region therein. These gates structures can each include a gate dielectric layer (e.g., a high K gate dielectric layer or any other suitable gate dielectric layer) immediately adjacent to the vertical sidewalls of each segment 242a-242c of the U-shaped semiconductor body 242 and a gate conductor layer positioned laterally immediately adjacent to the gate dielectric layer opposite the vertical sidewalls of each segment 242a-242c of the U-shaped semiconductor body 242.

Each feedback VFET 240, 240' can further include the following spacers: a lower spacer 231, which electrically isolates the first gate structure $245_1$ from the lower source/drain region 241; a middle spacer 239, which electrically isolates the first gate structure $245_1$ from the second gate structure $245_2$; and an upper spacer 232, which electrically isolates the second gate structure $245_2$ from the upper source/drain region 243. Specifically, the lower spacer 231 can be above the lower source/drain region 241 and can laterally surround a bottom end of the U-shaped semiconductor body 242. The first gate structure $245_1$ can be above the lower spacer 231 and can laterally surround a lower portion of the U-shaped semiconductor body. The middle spacer 239 can be above the first gate structure $245_1$ and can laterally surround a center portion of the U-shaped semiconductor body 242. The second gate structure $245_2$ can be above the middle spacer 239 and can laterally surround an upper portion of the U-shaped semiconductor body. The upper spacer 232 can be above the second gate structure $245_2$ and can laterally surround a top end of the U-shaped semiconductor body 242. The dielectric sidewall spacer 233, discussed above, can be above and immediately adjacent to the upper spacer 232 and can laterally surround the upper source/drain region 243. The lower, middle and upper spacers 231, 239 and 232 can be made of relatively thin layers of dielectric spacer material (e.g., hydrogenated silicon oxycarbide, silicon boron carbon nitride, silicon oxynitride or any other suitable dielectric spacer material). It should be noted that, as illustrated, outer sidewalls of the dielectric sidewall spacer 233, the upper spacer 232, the second gate structure $245_2$, the middle spacer 239 and the first gate structure $245_1$ can be essentially vertically aligned and the lower spacer 231 can extend laterally beyond those outer sidewalls (e.g., over the STI regions 235).

Each feedback VFET 240, 240' can further include a gate extension 246 in contact with the first gate structure $245_1$ adjacent to the open end 291 of the U-shaped semiconductor body 242 and further extending laterally away from the U-shaped semiconductor body and over an STI region 235 in the Z direction. For example, the gate extension 246 can extend into a space 230 between two rows of feedback VFETs in a VFET cell and, optionally, the first gate structure $245_1$ of each pair of feedback VFETs 240 and 240' on opposite sides of the space 230 can be in contact with the same gate extension. In any case, as discussed in greater detail below with regard to the method embodiments, this gate extension 246 can be formed during gate formation such that it is made of the same materials as the gate structures.

Each feedback VFET 240, 240' can be covered by one or more layers of interlayer dielectric (ILD) material 238. For example, ILD material 238 can be above each feedback VFET, on the top surface of the lower spacer 231 between each feedback VFET, and positioned laterally immediately adjacent to vertical surfaces of the first gate structure $245_1$, middle spacer 239, second gate structure $245_2$, upper spacer 232, and dielectric sidewall spacer 233 both inside and outside the U-shaped semiconductor body. The ILD material 138 can be silicon dioxide or any other suitable ILD material.

Each feedback VFET 240, 240' can further include contacts that extend through the ILD material 238 to the various VFET nodes. These contacts can include a lower source/drain contact 251. This lower source/drain contact 251 can be located adjacent to the closed end 292 of the U-shaped semiconductor body 242 and can extend vertically through the ILD material 238 to an edge portion of the lower source/drain region 241, which extends laterally beyond the connecting segment 242c of the U-shaped semiconductor body 242 in the Z direction (see FIGS. 2A, 2E and 2F). These contacts can further include an upper source/drain contact 252 that extends vertically through the ILD material 238 and the dielectric plug cap 236 so as to land on the metal plug 234. The upper source/drain contact 252 can further be aligned so that it is above at least one segment 242a-242c of the U-shaped semiconductor body 242. For example, a given feedback VFET 240, 240' could have an upper source/drain contact 252 that is aligned above only one segment of the U-shaped semiconductor body (e.g., see the upper source/drain contact 252 that is aligned above only segment 242a in the VFETs 240, 240' on the left side of the cell shown in FIG. 2A; see also the upper source/drain contact 252 that is aligned above only segment 242b in the VFETs 240, 240' on the right side of the cell shown in FIG. 2A) or above multiple segments of the U-shaped semiconductor body (e.g., see the upper source/drain contact 252 that is aligned above both parallel segments 242a and 242b in the VFETs 240, 240' at the center of the cell shown in FIG. 2A). These contacts can further include a gate extension contact 254, which extends vertically through the ILD material 238 and lands on a horizontal surface of the gate extension 246, thereby providing an electrical connection to the first gate structure $245_1$. These contacts can further include a gate contact 253, which extends vertically between the parallel segments 242a-242b of the U-shaped semiconductor body (e.g., near the open end 291) and which lands on ILD material 238 above the level of the middle spacer 239. Such a gate contact 253 can have opposing vertical surfaces that are in contact with vertical surfaces of the portions of the second gate structure $245_2$ on the upper portions of parallel segments of the U-shaped semiconductor body, respectively. Such a gate contact 253 can be electrically isolated from the first gate structure $245_1$ by the middle spacer 239 and ILD material 238 and from the upper source/drain region 243 by the dielectric plug cap 236 and the dielectric sidewall spacer 233.

In this structure, the gate extension contact 254 and the gate contact 253 provide the means for discretely and selectively biasing the first gate structure $245_1$ and the second gate structure $245_2$ to control current flow between the lower source/drain region 241 and the upper source/drain region 243, thereby allowing the feedback VFET to selectively function as either an N-type VFET or a P-type VFET. Techniques for selectively biasing the two gate structures of a feedback FET are known in the art. Thus, the details of those techniques have been omitted from this specification in order to allow the reader to focus on the salient aspects of the disclosed embodiments. However, generally such a feedback FET would operate as follows, when the lower source/drain region 241 is a P-type source/drain region and the upper source/drain region 243 is an N-type source/drain region. In the off-state, a positive gate voltage would be applied to the first gate structure $245_1$ and a negative gate voltage would be applied to the second gate structure $245_2$. In the P-type VFET mode (on-state), the gate voltage on the first gate structure $245_1$ is modulated and a negative gate voltage would be applied to the second gate structure $245_2$. In the N-type VFET mode (on-state), the gate voltage on the second gate structure $245_2$ is modulated and a positive gate voltage would be applied to the first gate structure $245_1$.

Thus, for example, in exemplary VFET cell shown in FIGS. 2A-2F, the gates of the feedback VFETs 240 in the first row 210 can be selectively biased so that these VFETs function as P-type VFETs and the gates of the feedback VFETs 240' in the second row 220 can be selectively biased so that these VFETs function as N-type VFET. Furthermore, the open ends 291 of all the U-shaped semiconductor bodies of all the feedback VFETs 240, 240' can be adjacent to the space 230 between the rows 210 and 220 such that the closed ends 292 of the U-shaped semiconductor bodies 242 of the feedback VFETs 240 in the first row 110 are at the top of the cell and the closed ends 292 of the U-shaped semiconductor bodies 242 of the feedback VFETs 240' in the second row 220 are at the bottom of the cell. Furthermore, the parallel segments of pairs of U-shaped semiconductors bodies on opposite sides of the space 230 can be aligned. In such a VFET cell, contact placement can optimized to both avoid critical design rule violations and allow for cell size scaling. For example, because each upper source/drain region 243 is also essentially U-shaped, the upper source/drain contacts 252 to the upper source/drain regions 243 of standard VFETs in the same row can land on adjacent upper source/drain regions and still be separated by a sufficient distance to avoid shorting and/or coupling issues. For example, upper source/drain contact placement can be such that upper source/drain contacts contact each upper source/drain region but no two upper source/drain contacts contact adjacent parallel segments of different U-shaped semiconductor bodies in the same row.

Also disclosed herein are method embodiments for forming the above-described semiconductor structures. Generally, the method embodiments include providing a semiconductor substrate and forming one or more vertical field effect transistors (VFET) on the substrate such that each VFET includes an essentially U-shaped semiconductor body. That is, the semiconductor body has three segments including two parallel segments and a connecting segment that extends laterally between adjacent ends of the two parallel segments. The three segments have essentially equal heights and, thus, the semiconductor body is essentially U-shaped (as viewed from above) with a closed end (i.e., the base of the U-shape defined by the connecting segment) and an open end opposite the closed end.

Figure 3:
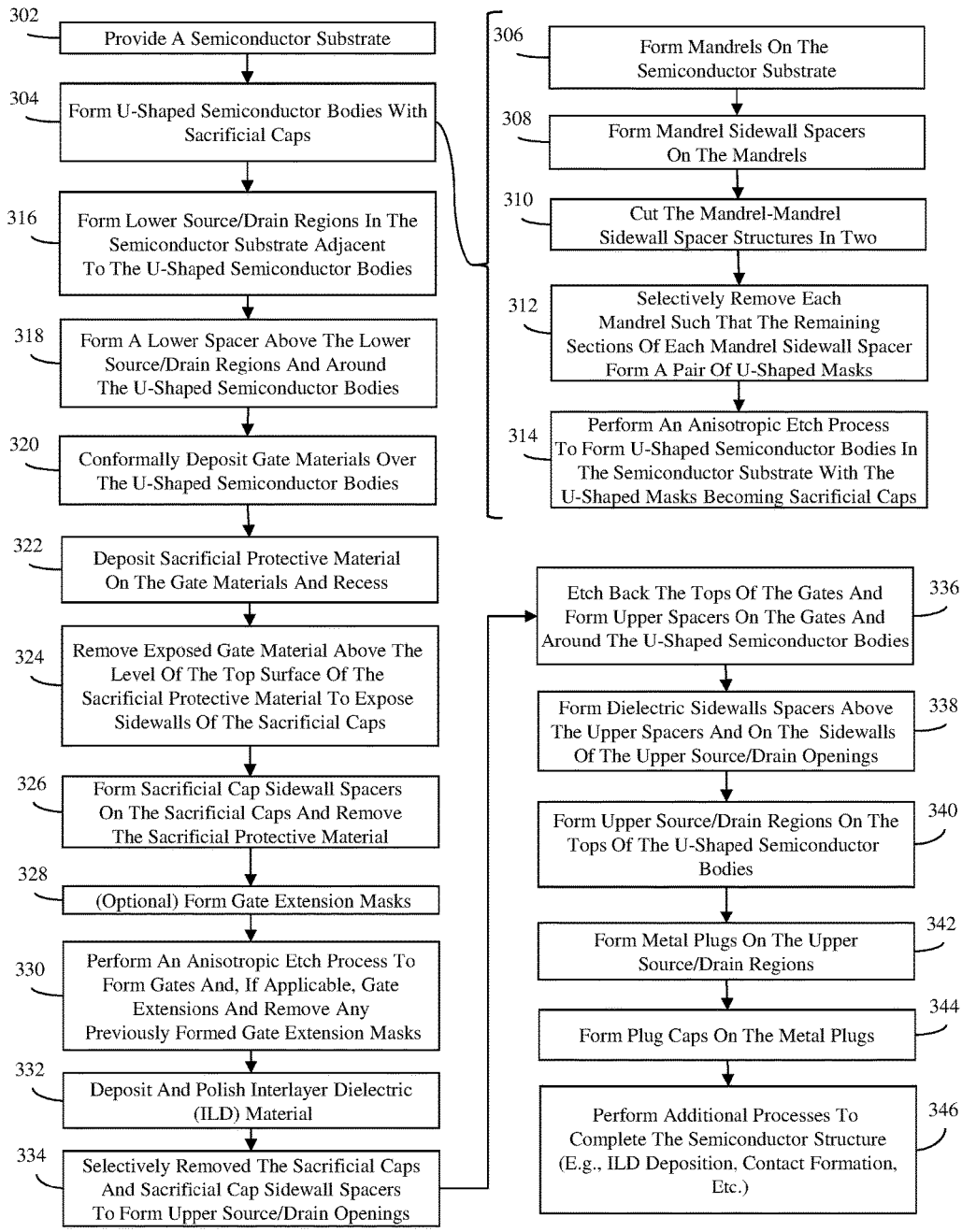
FIG. 3 is a flow diagram illustrating a method of forming the semiconductor structure illustrated in FIGS. 1A-1F.

FIG. 3 is a flow diagram illustrating a method of forming a semiconductor structure with one or more standard VFETs 140, 140', each having an essentially U-shaped semiconductor body 142, as shown in FIGS. 1A-1F. For purposes of illustration, the method is described below and illustrated in the Figures with respect to the formation of a VFET cell that includes a first row 110 of standard VFETs 140 (e.g., P-type VFETs), each with a U-shaped semiconductor body 142, and a second row 120 of standard VFETs 140' (e.g., N-type VFETs), each also with a U-shaped semiconductor body 142.

Figure 4A:
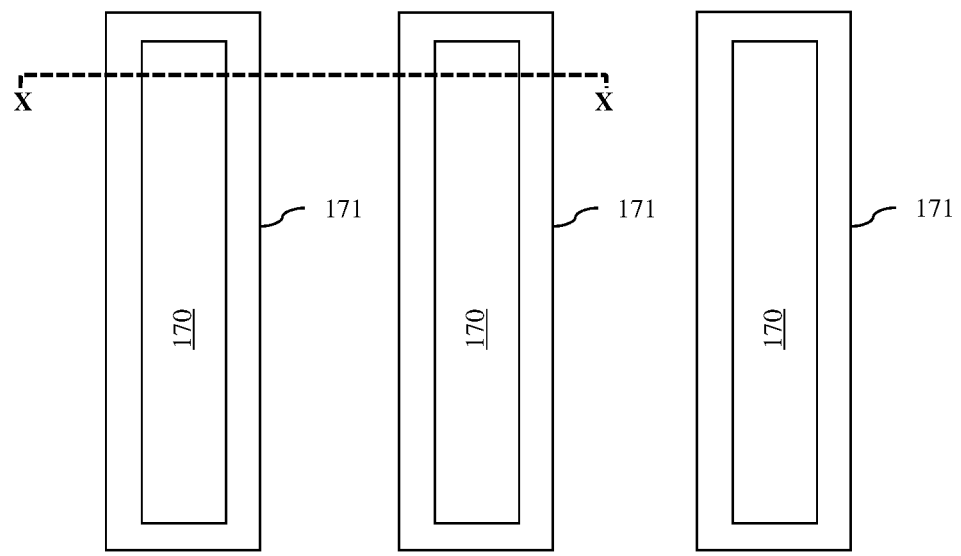
FIGS. 4A and 4B are layout and cross-section diagrams, respectively, illustrating a partially completed structure formed according to the method of FIG. 3.
Figure 4B:
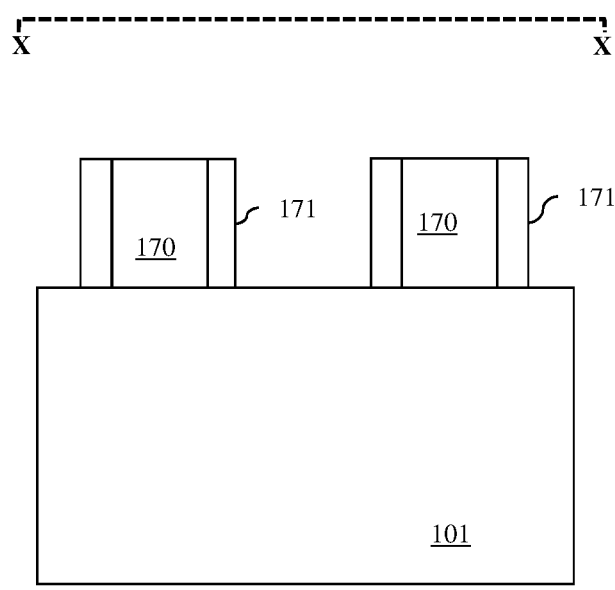

This method includes providing a semiconductor substrate 101 (see process 302 and FIGS. 4A-4B). The semiconductor substrate 101 can be a bulk semiconductor substrate (e.g., a bulk silicon substrate), as illustrated. Alternatively, the semiconductor substrate 101 can be a semiconductor layer of a semiconductor-on-insulator structure (e.g., a silicon layer of a silicon-on-insulator (SOI) structure).

This method further includes forming two rows of essentially U-shaped semiconductor bodies on the semiconductor substrate 101 (see process 304).

For example, to form the rows of U-shaped semiconductor bodies at process 304, sacrificial mandrels 170 (e.g., rectangular shaped bodies) can be formed on the semiconductor substrate 101 (see process 306 and FIGS. 4A-4B). That is, mandrel material can be deposited onto the semiconductor substrate and then lithographically patterned and etched. Mandrel sidewall spacers 171 (e.g., silicon nitride sidewall spacers) can then be formed on the mandrels 170, respectively, using conventional sidewall spacer formation techniques (see process 308 and FIGS. 4A-4B). The mandrel and mandrel sidewall spacer materials can be different so as to allow for selective etching during subsequent processing.

Figure 5:
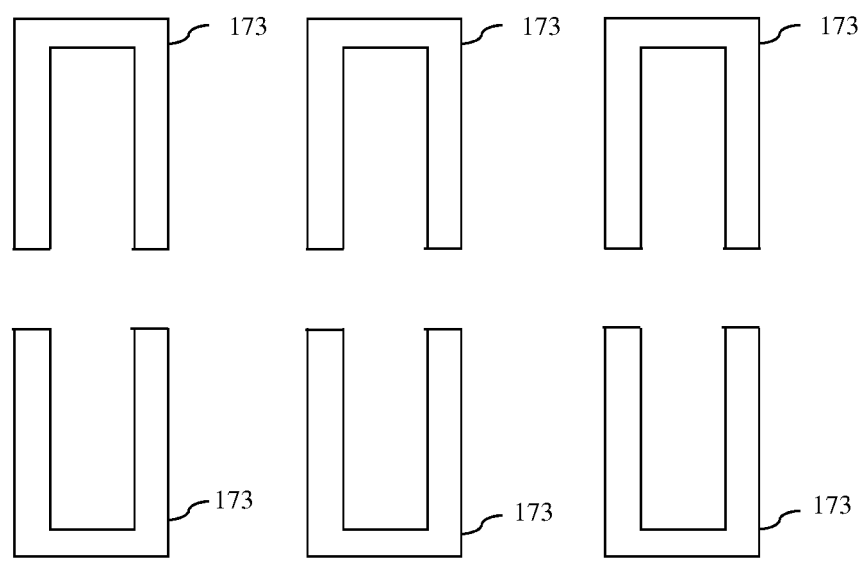
FIG. 5 is layout diagram illustrating a partially completed structure formed according to the method of FIG. 3.

After the mandrel sidewall spacers 171 are formed, a trench can be formed (e.g., patterned and etched) so that it cuts across the mandrel-mandrel sidewall spacer structures, thereby cutting each mandrel-mandrel sidewall spacer structure in two (see process 310). Then, the remaining sections of the mandrels 170 can be selectively removed such that the remaining sections of the each mandrel sidewall spacer 171 forms two essentially U-shaped masks 173 on the semiconductor substrate 101 (see process 312 and FIG. 5).

Figure 6A:
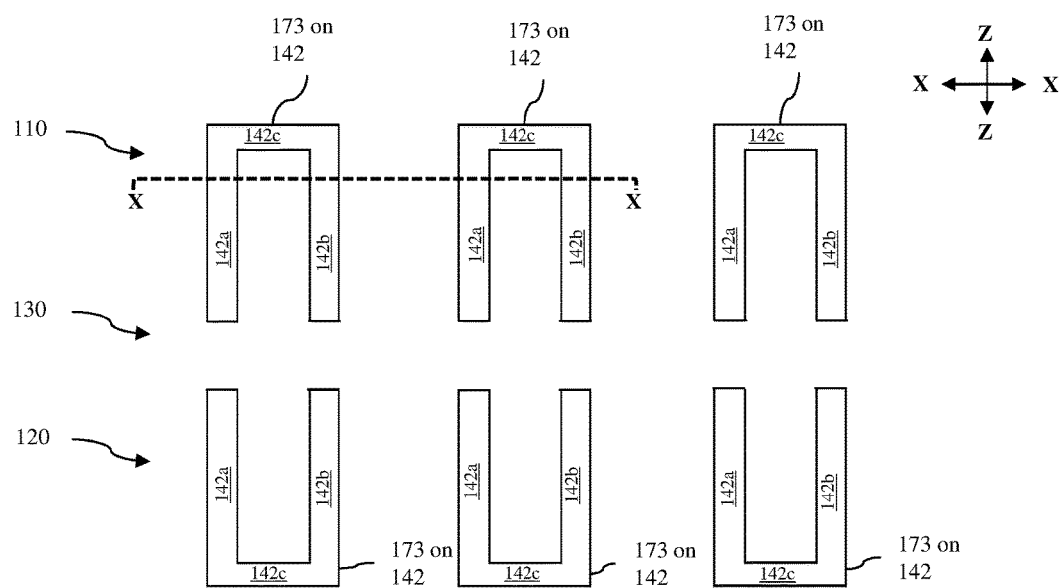
FIGS. 6A and 6B are layout and cross-section diagrams, respectively, illustrating a partially completed structure formed according to the method of FIG. 3.
Figure 6B:
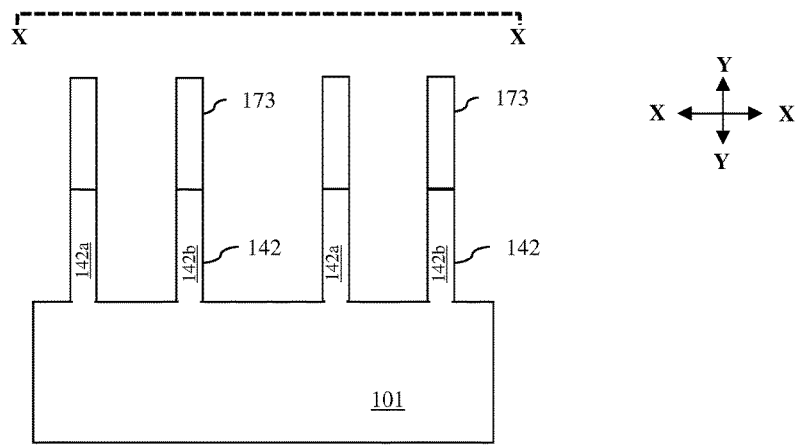
Figure 7A:
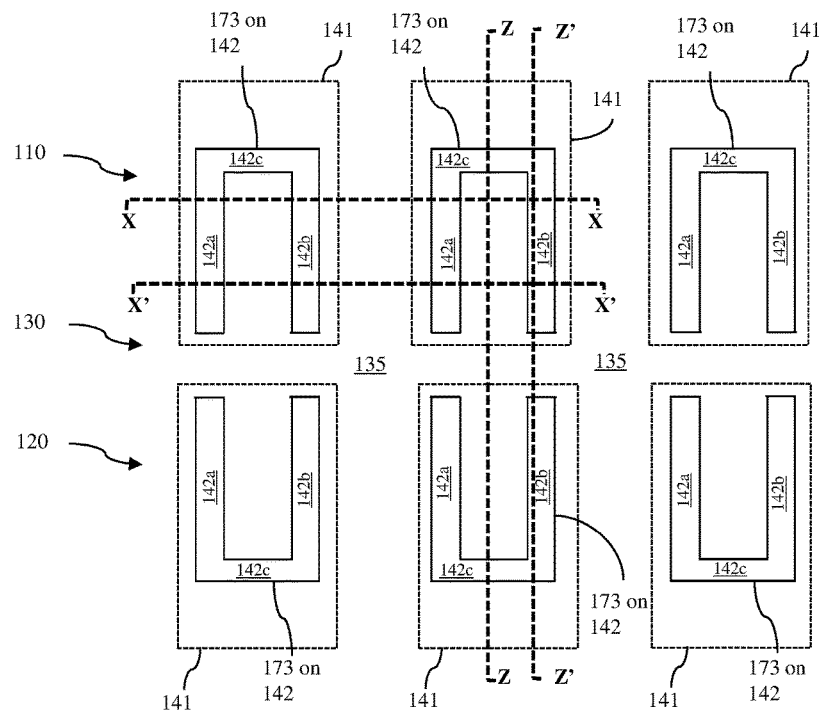
FIGS. 7A and 7B-7E are layout and cross-section diagrams, respectively, illustrating a partially completed structure formed according to the method of FIG. 3.
Figures 7B, 7C:
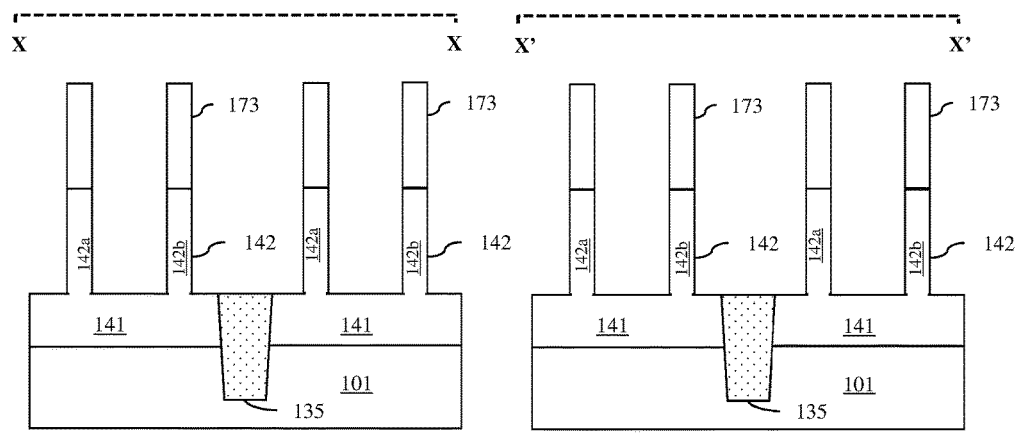
Figure 7D:
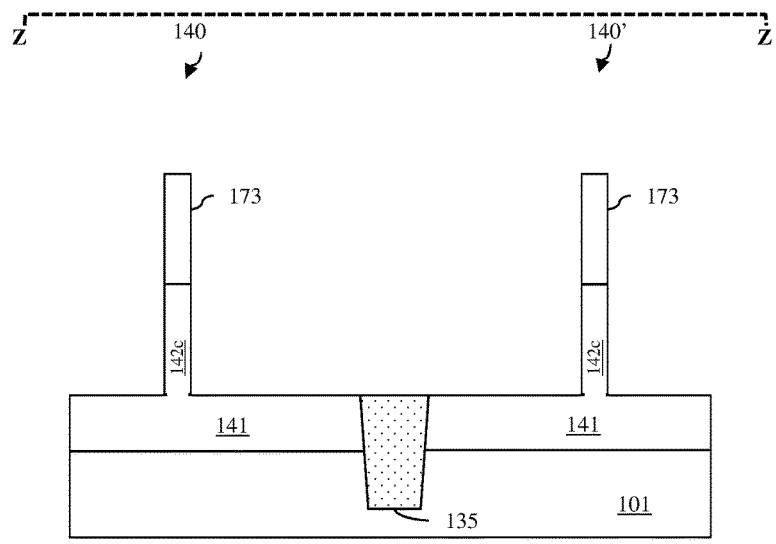
Figure 7E:
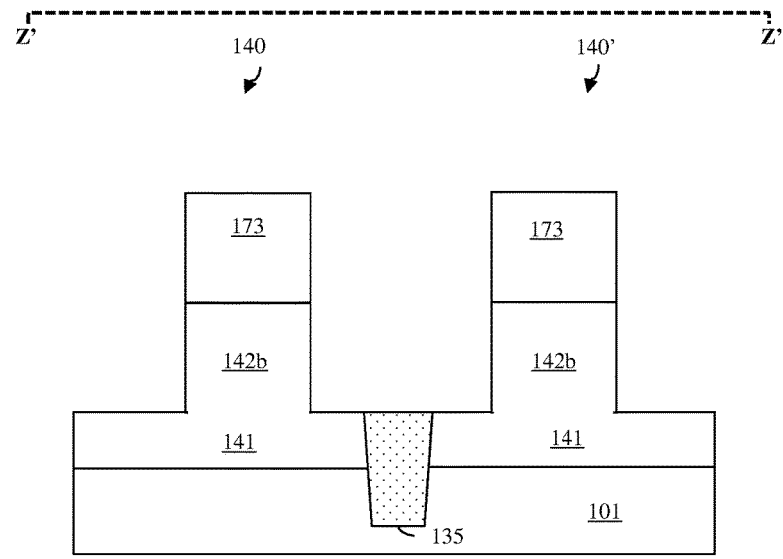

Once the U-shaped masks 173 are formed, an anisotropic etch process can be performed in order to transfer the image of the essentially U-shaped masks 173 into the upper portion of the semiconductor substrate 101, thereby forming rows of U-shaped semiconductor bodies 142 below the U-shaped masks 173 (see process 314 and FIGS. 6A-6B). Thus, the U-shaped masks 173 effectively become sacrificial caps on the tops of U-shaped semiconductor bodies 142, respectively. Alternatively, any other suitable technique could be used to form the rows of U-shaped semiconductor bodies with sacrificial caps thereon.

Each U-shaped semiconductor body 142 formed at process 314 has three segments 142a-142c including two parallel segments 142a-142b and a connecting segment 142c, which extends laterally between adjacent ends of the parallel segments 142a-142b. The parallel segments can be oriented in the Z direction and the connecting segment can be oriented in the X direction. The heights of the three segments 142a-142c, as measured in the Y direction, can be essentially the same such that each semiconductor body 142 is essentially U-shaped (as viewed from above) with a closed end 192 (i.e., the base of the U-shape defined by the connecting segment) and an open end 191 opposite the closed end 192.

The two rows of U-shaped semiconductor bodies can then be used, as discussed below, to form a first row 110 of standard VFETs 140 (e.g., P-type VFETs) and a second row 120 of VFETs 140' (e.g., N-type VFETs) adjacent to the first row 110 and separated therefrom by a space 130. Specifically, after the U-shaped semiconductor bodies 142 are formed at process 314, lower source/drain regions 141 and shallow trench isolation (STI) regions in the semiconductor substrate 101 can be formed within the semiconductor substrate 101 such that the lower source/drain regions are adjacent to the bottoms of the U-shaped semiconductor bodies 142 and such that each lower source/drain region is laterally surrounded by an STI region 135 (see process 316 and FIGS. 7A-7E). Techniques for forming such lower source/drain regions and STI regions are well known in the art and, thus, the details of such techniques have been omitted from this specification in order to allow the reader to focus on the salient aspects of the disclosed methods. It should be understood that discrete process steps can be performed in order to form the P-type lower source/drain regions for P-type VFETs (e.g., for the VFETs 140 in the first row 110) and the N-type lower source/drain regions for N-type VFETs (e.g., for the VFETs 140' in the second row 120).

Figure 8A:
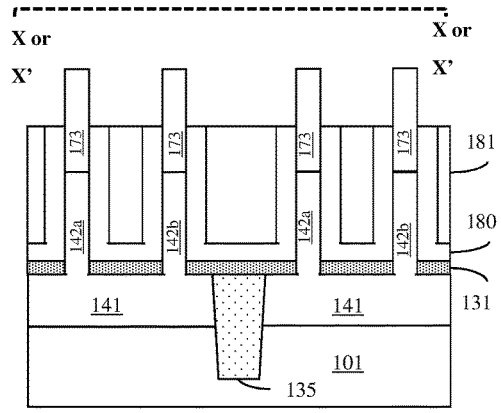
FIGS. 8A-8C are cross-section diagrams illustrating a partially completed structure formed according to the method of FIG. 3.
Figure 8B:
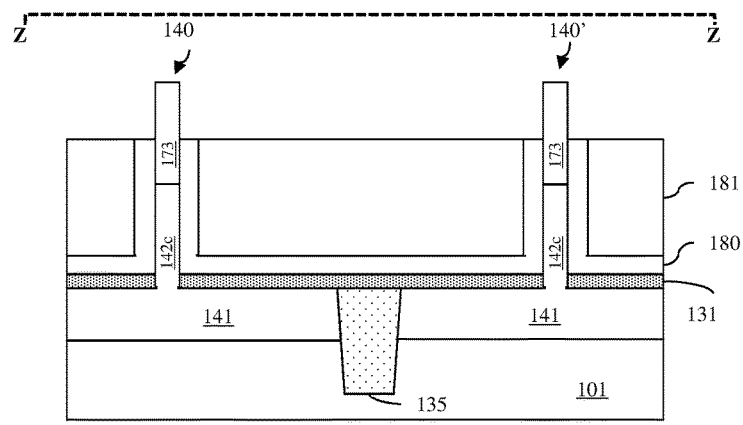
Figure 8C:
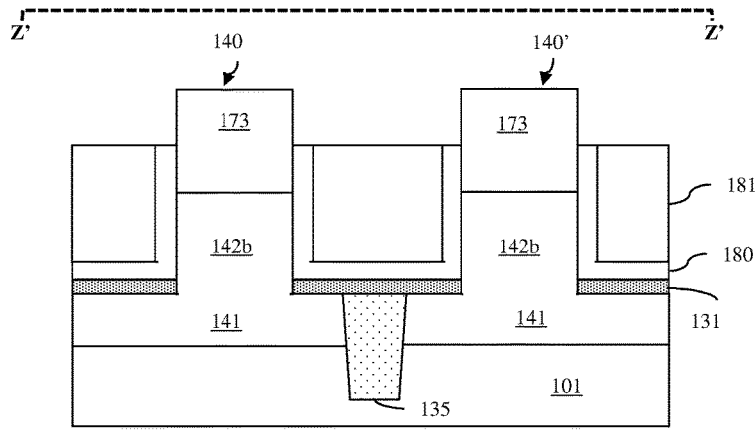

After the lower source/drain regions 141 are formed, a lower spacer 131 can be formed so as to cover the lower source/drain regions 141 and further so as to laterally surround the bottom ends of each of the sections of each U-shaped semiconductor body 142 (see process 318 and FIGS. 8A-8C). For example, dielectric material can be deposited and etched back to expose all but the bottom ends of each U-shaped semiconductor body. Alternatively, a directional deposition process could be used to deposit a thin layer of the dielectric material on the horizontal surfaces only of the partially completed structure. In any case, the dielectric material can be, for example, hydrogenated silicon oxycarbide, silicon boron carbon nitride, silicon oxynitride or any other suitable dielectric material.

Next, gate materials 180, including a gate dielectric layer and a gate conductor layer, can be conformally deposited over the partially completed structure (i.e., on the lower spacer 131 and and over the capped U-shaped semiconductor bodies 142 (see process 320 and FIGS. 8A-8C). The gate dielectric layer can be, for example, a high-K gate dielectric layer. The gate conductor layer can be a metal or metal alloy layer. It should be understood that if different work function metals or metal alloys are to be used for P-type VFETs (e.g., for the VFETs 140 in the first row 110) and N-type VFETs (e.g., for the VFETs 140' in the second row 120), these different work function metals or metal alloys can be deposited during discrete masked deposition processes.

Figure 9A:
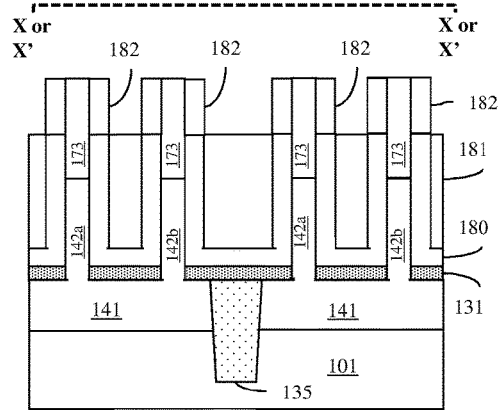
FIGS. 9A-9C are cross-section diagrams illustrating a partially completed structure formed according to the method of FIG. 3.
Figure 9B:
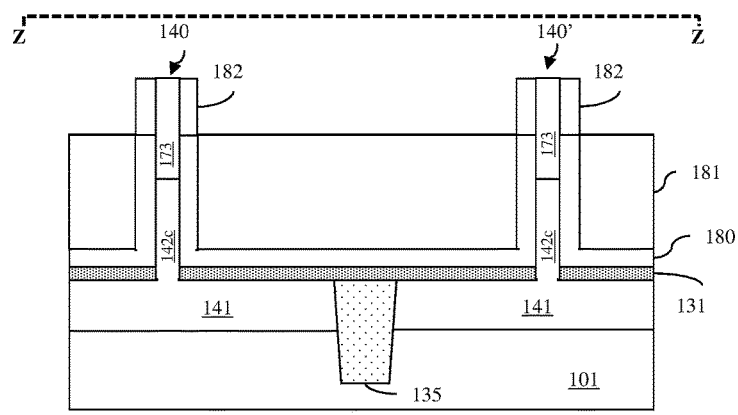
Figure 9C:
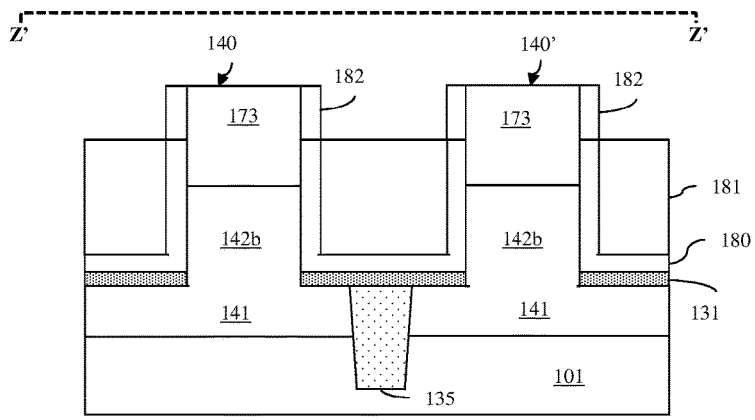

After deposition of the gate materials 180, a sacrificial protective material 181 (e.g., a sacrificial optical planarization layer (OPL)) can be deposited on the gate conductor layer and recessed so that the top surface of the sacrificial protective material 181 is below the level of the tops of the sacrificial caps 173, but above the level of the tops of the U-shaped semiconductor bodies 142 (see process 322 and FIGS. 8A-8C). Any exposed gate materials 180 above the top surface of the sacrificial protective material 181 can then be selectively removed (i.e., selectively etched away), thereby exposing the sidewalls of the sacrificial caps 173 (see process 324 and FIGS. 8A-8C). Sacrificial cap sidewall spacers 182 can then be formed (e.g., using conventional sidewall spacer formation techniques) on the exposed sidewalls of the sacrificial caps 173 (see process 326 and FIGS. 9A-9C). As illustrated, the sacrificial cap sidewall spacers 182 will laterally surround the sacrificial caps 173 and will cover exposed upper ends of the gate materials 180. Once the sacrificial cap sidewall spacers 182 are formed, the sacrificial protective material 181 can be selectively removed. As discussed in greater detail below, the sacrificial caps 173 and sacrificial cap sidewall spacers thereon will function as gate masks during subsequent processing.

Figure 10A:
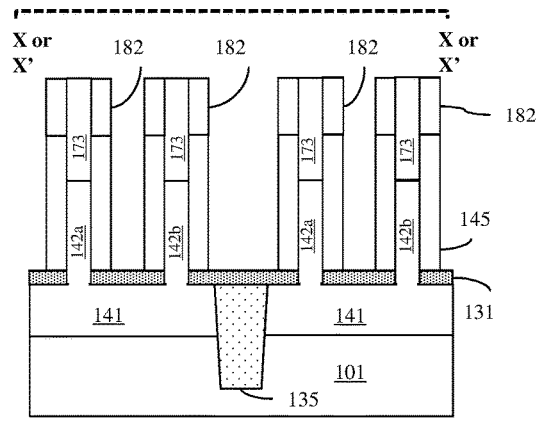
FIGS. 10A-10C are cross-section diagrams illustrating a partially completed structure formed according to the method of FIG. 3.
Figure 10B:
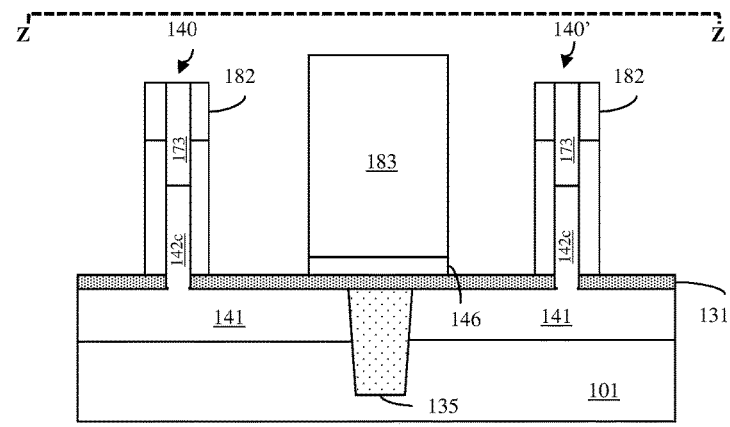
Figure 10C:
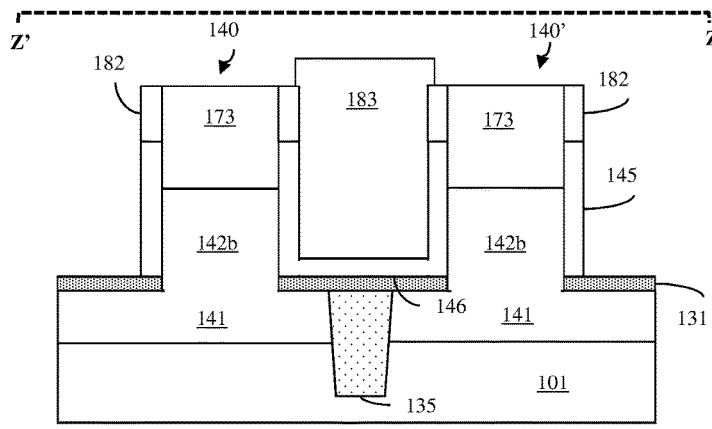

Optionally, one or more gate extension masks 183 can be formed on the gate materials 180 (e.g., in the space 130 between adjacent pairs of U-shaped semiconductor bodies) (see process 328 and FIGS. 10A-10C). Then, an anisotropic etch process can be performed to directionally etch exposed gate material 180 (see process 330 and FIGS. 10A-10C). The sacrificial caps 173 and sacrificial cap sidewall spacers 182 function as gate masks such that portions of the gate material remain positioned laterally adjacent to the vertical sidewalls of each U-shaped semiconductor body 142 and, thereby form gate structures 145. This anisotropic etch process will also simultaneously form gate extensions 146 under any previously formed gate extension masks 183. The gate extension masks 183 can then be selectively removed.

Figure 11A:
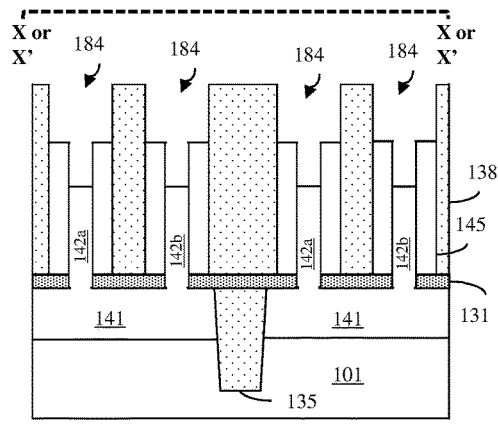
FIGS. 11A-11C are cross-section diagrams illustrating a partially completed structure formed according to the method of FIG. 3.
Figure 11B:
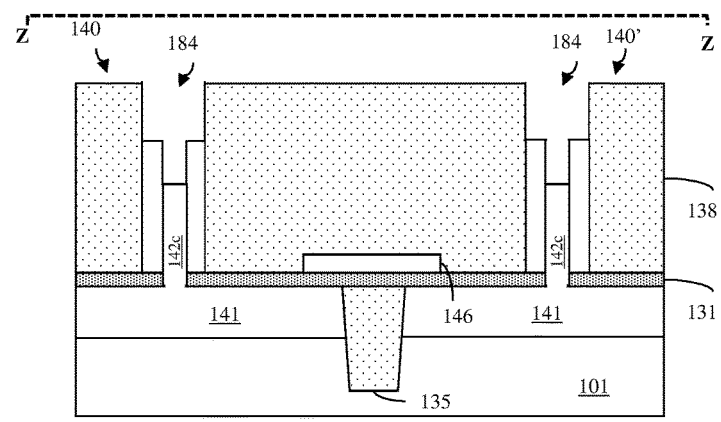
Figure 11C:
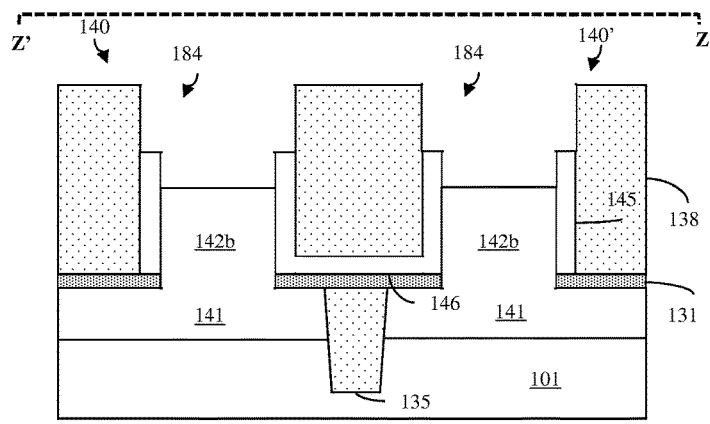

Interlayer dielectric (ILD) material 138 (e.g., silicon dioxide or any other suitable ILD material) can be deposited over the partially completed structure and polished (e.g., using a chemical mechanical polishing (CMP) process) to expose the top surfaces of the sacrificial caps 173 and the adjacent sacrificial cap sidewall spacers 182 (see process 332). The sacrificial caps 173 and the adjacent sacrificial cap sidewall spacers 182 can then be selectively removed to form upper source/drain openings 184, where each upper source/drain opening 184 exposes the top of a U-shaped semiconductor body 142 and the gate structure 145 that laterally surrounds the U-shaped semiconductor body 142 (see process 334 and FIGS. 11A-11C). As illustrated, within these upper source/drain openings 184, the tops of the gate structures 145 will be above the levels of the tops of the U-shaped semiconductor bodies 142. Thus, at this point in the processing, the tops of the gate structures 145 can be recessed (i.e., selectively etch backed) to some depth below the level of the tops of the U-shaped semiconductor bodies 142, thereby creating recesses for upper spacers. This process of etching back the tops of the gate structures 145 also ensures that the heights of the gate structures 145 are essentially uniform.

Figure 12A:
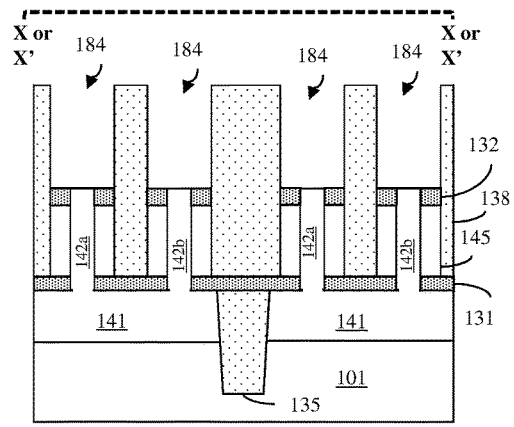
FIGS. 12A-12C are cross-section diagrams illustrating a partially completed structure formed according to the method of FIG. 3.
Figure 12B:
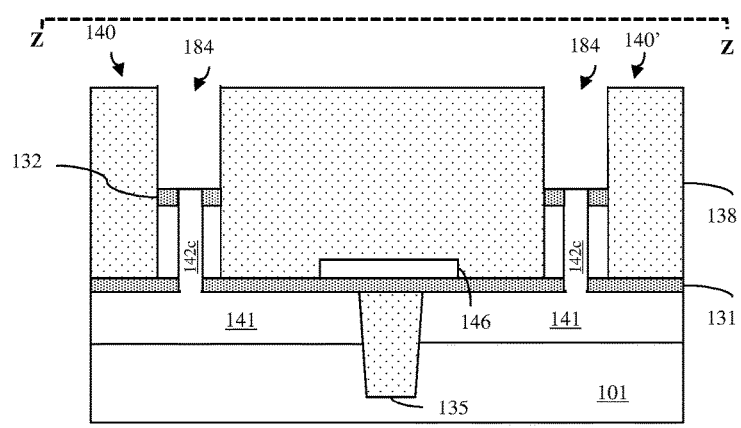
Figure 12C:
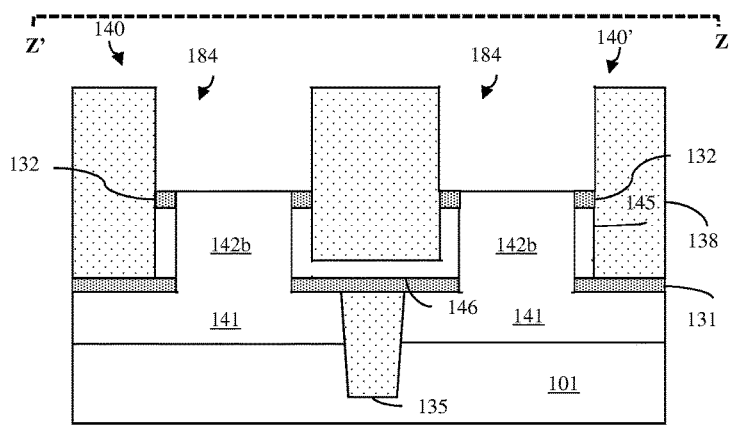

Upper spacers 132 can then be formed on the gate structures 145 in the recesses such that the upper spacers 132 laterally surround the top ends of the U-shaped semiconductor bodies 142, respectively (see process 336 and FIGS. 12A-12C). The upper spacers 132 can be made, for example, by conformally depositing dielectric material into the upper source/drain openings 184 and then isotropically etching the dielectric material until the tops of the U-shaped semiconductor bodies 142 are exposed. The dielectric material used for the upper spacers 132 can be, for example, the same dielectric material as that used for the lower spacer 131 (e.g., hydrogenated silicon oxycarbide, silicon boron carbon nitride, silicon oxynitride or any other suitable dielectric spacer material).

Figure 13A:
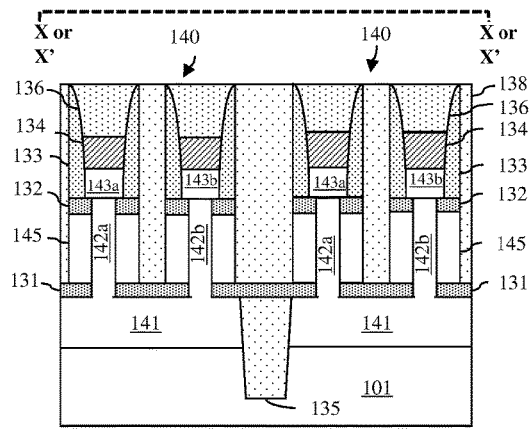
FIGS. 13A-13C are cross-section diagrams illustrating a partially completed structure formed according to the method of FIG. 3.
Figure 13B:
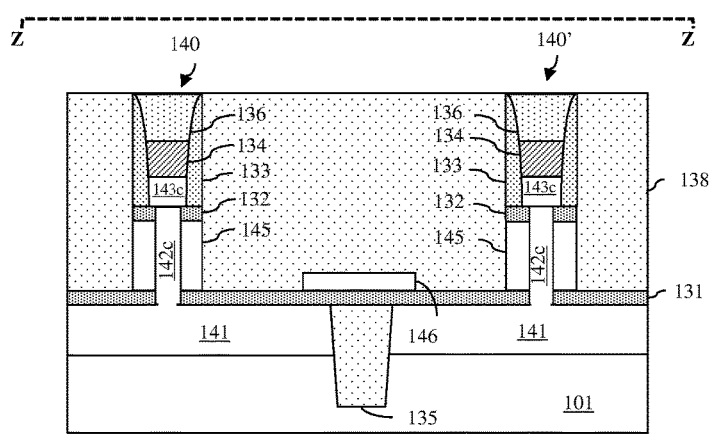
Figure 13C:
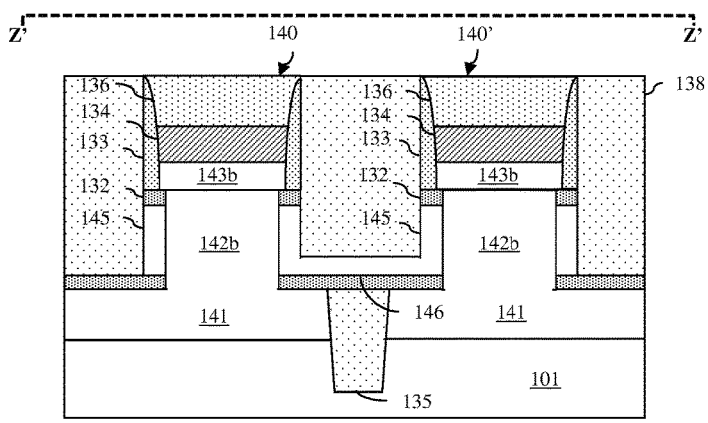

Dielectric sidewall spacers 133 can then be formed in the upper source/drain openings 184 (e.g., using convention sidewall spacer formation techniques) (see process 338 and FIGS. 13A-13C). As illustrated, the dielectric sidewall spacers 133 formed at process 338 will be above the upper spacers 132 and positioned laterally adjacent to the sidewalls of the upper source/drain openings 184. The dielectric material used to form the dielectric sidewall spacers 133 can be, for example, silicon nitride or any other suitable dielectric sidewall spacer material.

After the dielectric sidewall spacers 133 are formed on the sidewalls of the upper source/drain openings 184, an upper source/drain region 143 can be formed in each upper source/drain opening 184 on top of the U-shaped semiconductor body 142 (see process 340 and FIGS. 13A-13C). Specifically, the upper source/drain regions 143 can be formed, for example, by depositing in situ doped, epitaxial, semiconductor material into the upper source/drain openings 184 on the tops of the U-shaped semiconductor bodies such that each upper source/drain regions is essentially U-shaped and laterally surrounded by a dielectric sidewall spacer 133. It should be understood that discrete process steps can be performed in order to form P-type upper source/drain regions for P-type VFETs (e.g., for the VFETs 140 in the first row 110) and N-type upper source/drain regions for N-type VFETs (e.g., for the VFETs 140' in the second row 120).

Metal plugs 134 can then be formed in the upper source/drain openings 184 on the top surfaces of the upper source/drain regions 143 such that each metal plug 134 is also essentially U-shaped and surrounded by a dielectric sidewall spacer 133 (see process 342 and FIGS. 13A-13C). For example, a metal or metal alloy material (e.g., tungsten, cobalt, aluminum or any other suitable metal plug material) can be deposited into the upper source/drain openings 184 on the upper source/drain regions 143 and then recessed. Dielectric plug caps 136 can then be formed in the upper source/drain openings 184 on the metal plugs 134 (see process 344 and FIGS. 13A-13C). For example, a dielectric material can be deposited to fill the remaining space within the upper source/drain openings 184 and a polishing process (e.g., a chemical mechanical polishing (CMP) process) can be performed to remove any of this dielectric material from above the top surface of the ILD material. The dielectric material used for the dielectric plug cap 136 can be, for example, silicon nitride or any other suitable dielectric plug cap material.

Additional processing can then be performed in order to complete the standard VFETs 140, 140' in the semiconductor structure 100 (see process 346 and FIGS. 1A-1F). The additional processing can include deposition of additional ILD material 138 as well as the formation of contacts that extend through the ILD material 138 to the various VFET nodes. For each VFET 140, 140', these contacts can include a lower source/drain contact 151, which is formed so that it is adjacent to the closed end 192 of the U-shaped semiconductor body 142, so that it extends vertically through the ILD material 138 and so that it lands on an edge portion of the lower source/drain region 141. These contacts can further include an upper source/drain contact 152, which is formed so that it extends vertically through the ILD material 138 and the dielectric plug cap 136 and so that it lands on the metal plug 134. These contacts can further include either a gate contact 153 or a gate extension contact 154. A gate contact 153 can be formed so that it extends vertically between the parallel segments 142a-142b of the U-shaped semiconductor body (e.g., near the open end 191), so that it lands on the lower spacer 131 and so that it has opposing vertical surfaces that are in contact with vertical surfaces of the portions of the gate structure 145 on the parallel segments of the U-shaped semiconductor body, respectively. Such a gate contact 153 will be electrically isolated from the lower source/drain region 141 by the lower spacer 131 and from the upper source/drain region 143 by the dielectric plug cap 136 and the dielectric sidewall spacer 133. Alternatively, a gate extension contact 154 can be formed so that it extends vertically through the ILD material 138 and so that it lands on a horizontal surface of the gate extension 146. In any case, techniques for forming the contacts are well known in the art and, thus, the details of those techniques have been omitted from this specification in order to allow the reader to focus on the salient aspects of the disclosed embodiments. As discussed in detail above, contact placement, particularly, with respect to the various VFETs in a VFET cell can be optimized to avoid critical design rule violations and allow for cell size scaling.

Figure 14:
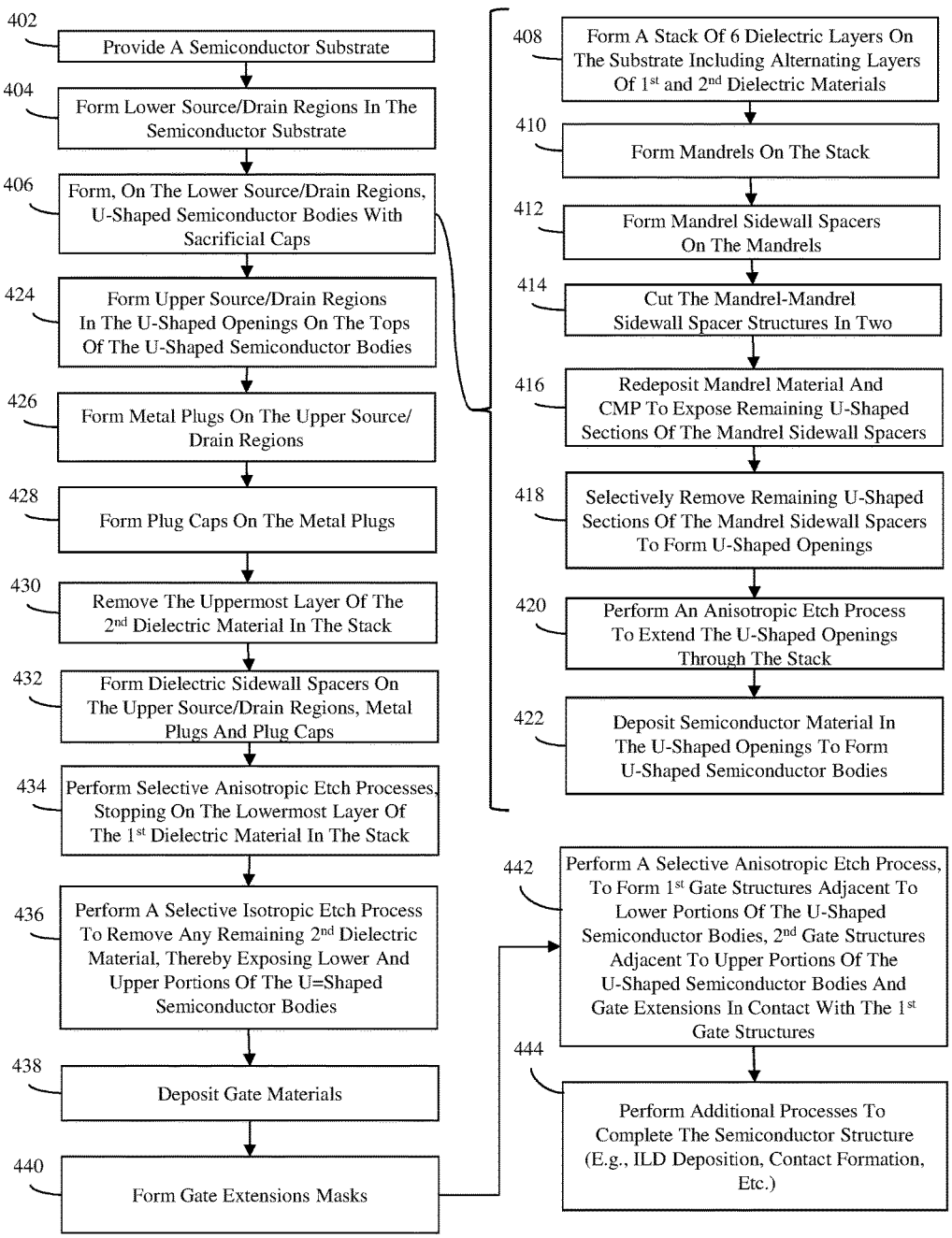
FIG. 14 is a flow diagram illustrating a method of forming the semiconductor structure illustrated in FIGS. 1A-2F.

FIG. 14 is a flow diagram illustrating a method of forming a semiconductor structure with one or more feedback VFETs 240, 240', each having an essentially U-shaped semiconductor body 242, as shown in FIGS. 2A-2F. For purposes of illustration, the method is described below and illustrated in the Figures with respect to the formation of a VFET cell that includes a first row 210 of feedback VFETs 240, each with a U-shaped semiconductor body 242, and a second row 220 of feedback VFETs 240', each also with a U-shaped semiconductor body 242.

Figure 15A:
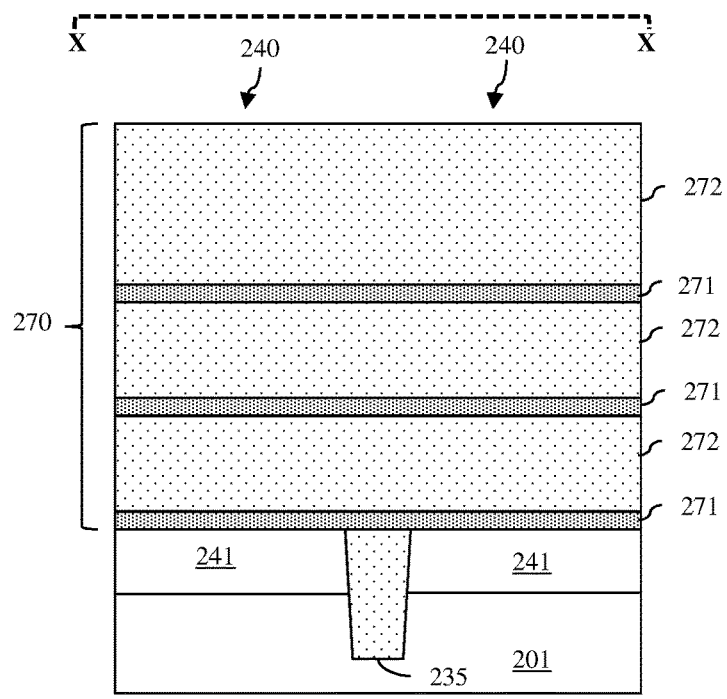
FIGS. 15A-15B cross-section diagrams, respectively, illustrating a partially completed structure formed according to the method of FIG. 14.
Figure 15B:
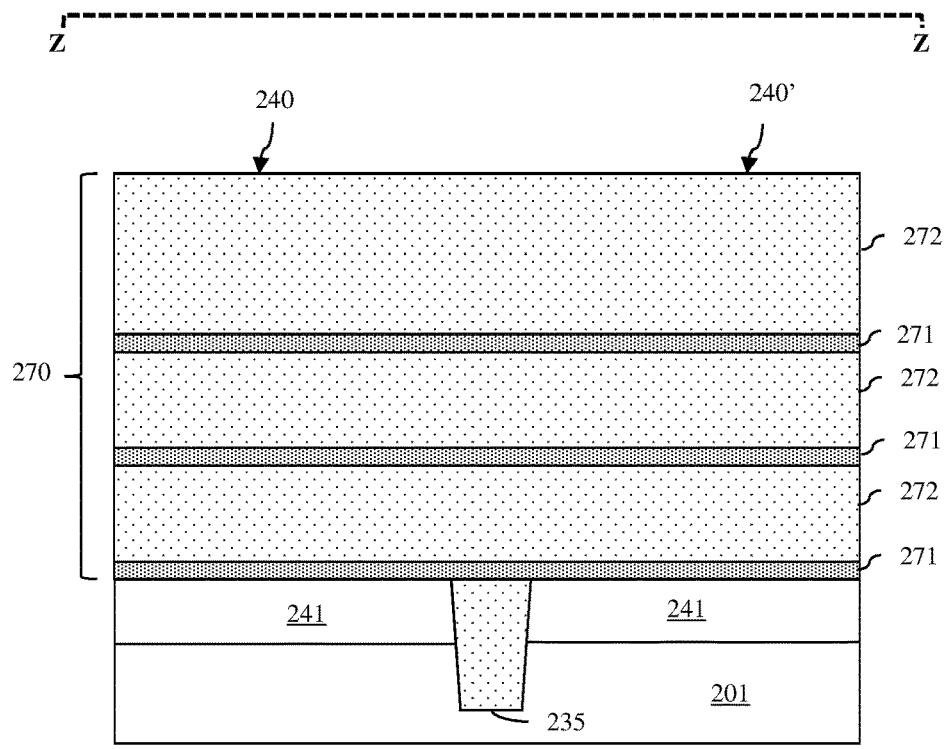

This method includes providing a semiconductor substrate 201 (see process 402 and FIGS. 15A-15B). The semiconductor substrate 201 can be a bulk semiconductor substrate (e.g., a bulk silicon substrate), as illustrated. Alternatively, the semiconductor substrate 201 can be a semiconductor layer of a semiconductor-on-insulator structure (e.g., a silicon layer of a silicon-on-insulator (SOI) structure).

Two rows of lower source/drain regions 241 and shallow trench isolation (STI) regions 235, which laterally surround the lower source/drain regions 241, can be formed in the semiconductor substrate 201 (see process 404 and FIGS. 15A-15B). Techniques for forming such lower source/drain regions and STI regions are well known in the art and, thus, the details of such techniques have been omitted from this specification in order to allow the reader to focus on the salient aspects of the disclosed methods. In any case, the lower source/drain regions 241 can be formed so as to have a first-type conductivity.

U-shaped semiconductor bodies 242 can then be formed on the lower source/drain regions 241, respectively (see process 406).

Specifically, after forming the lower source/drain regions 241, a stack 270 of six dielectric layers can be formed on the partially completed structure and, particularly, over the lower source/drain regions 241 (see process 408 and see FIGS. 15A-15B). This stack 270 can include alternating layers of a first dielectric material 271 and a second dielectric material 272. The first dielectric material 271 can be, for example, hydrogenated silicon oxycarbide, silicon boron carbon nitride, silicon oxynitride or any other suitable dielectric spacer material. Each of the layers of the first dielectric material 271 can be relatively thin and, particularly, can have thicknesses equal to desired spacer height. The second dielectric material 272 can be different from the first dielectric material 271. For example, the second dielectric material can be silicon dioxide. The layers of the second dielectric material 272 can be relatively thick as compared to the layers of first dielectric material 271 and the lower two layers of the second dielectric material 272 can have thicknesses that are equal desired heights of first and second gates, as discussed in greater detail below.

Figure 16A:
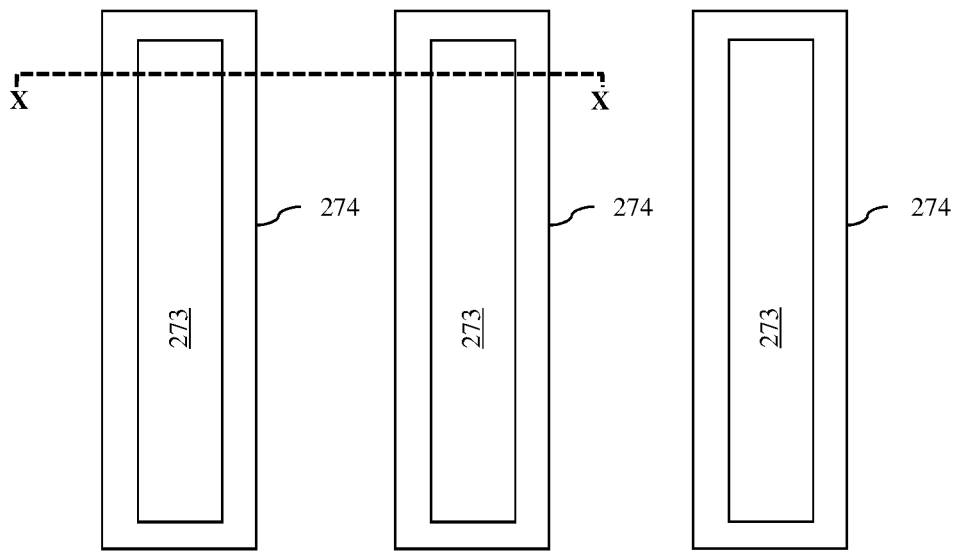
FIGS. 16A and 16B are layout and cross-section diagrams, respectively, illustrating a partially completed structure formed according to the method of FIG. 14.
Figure 16B:
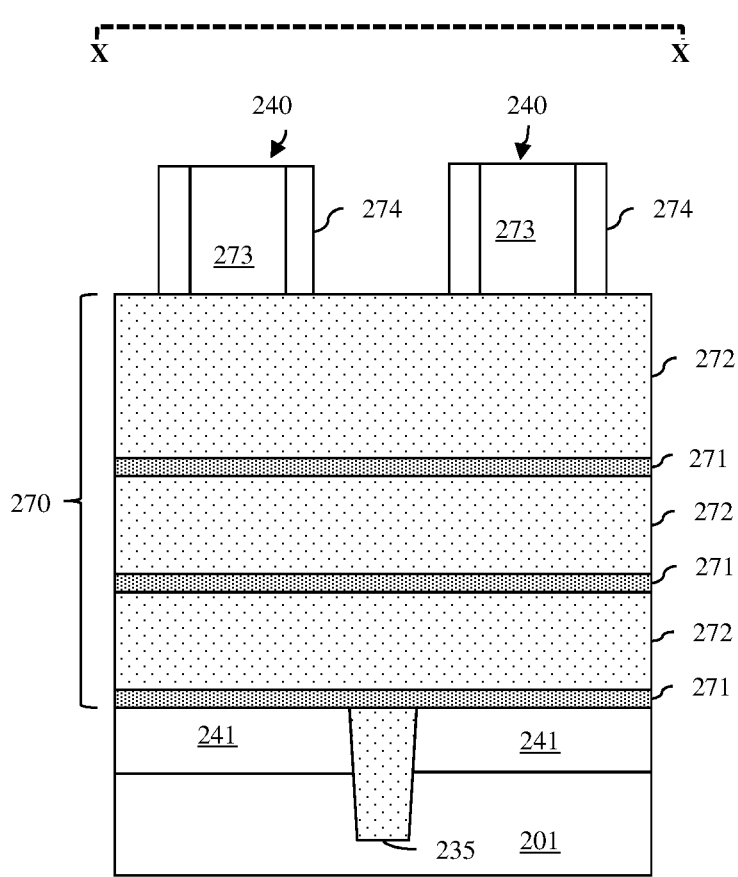
Figure 17A:
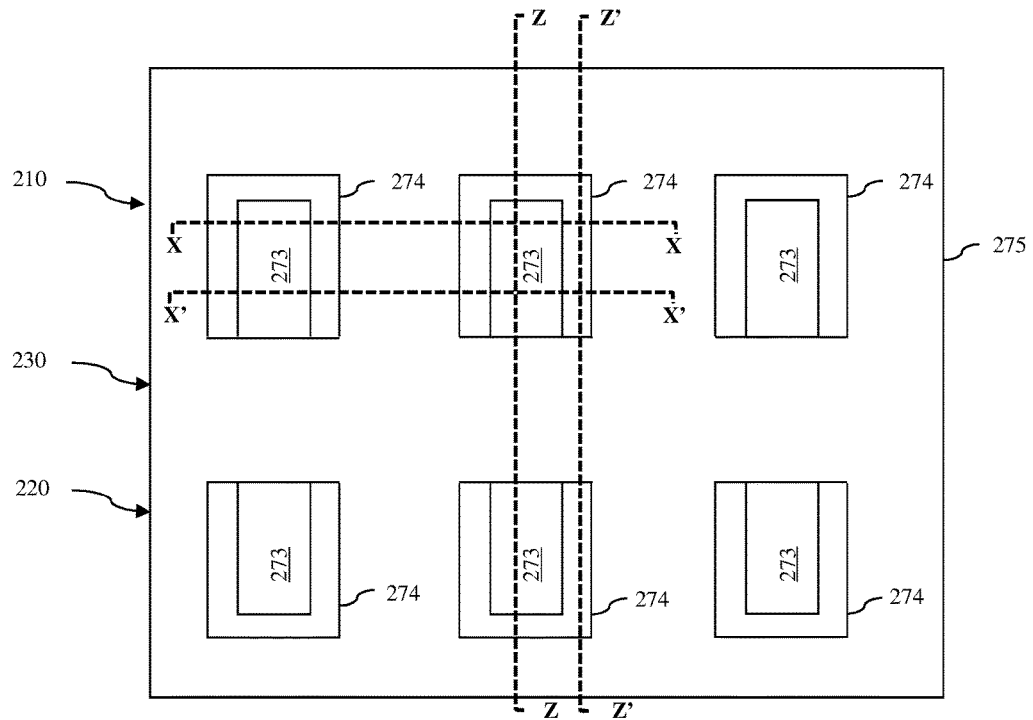
FIGS. 17A and 17B-17D are layout and cross-section diagrams, respectively, illustrating a partially completed structure formed according to the method of FIG. 14.
Figure 17B:
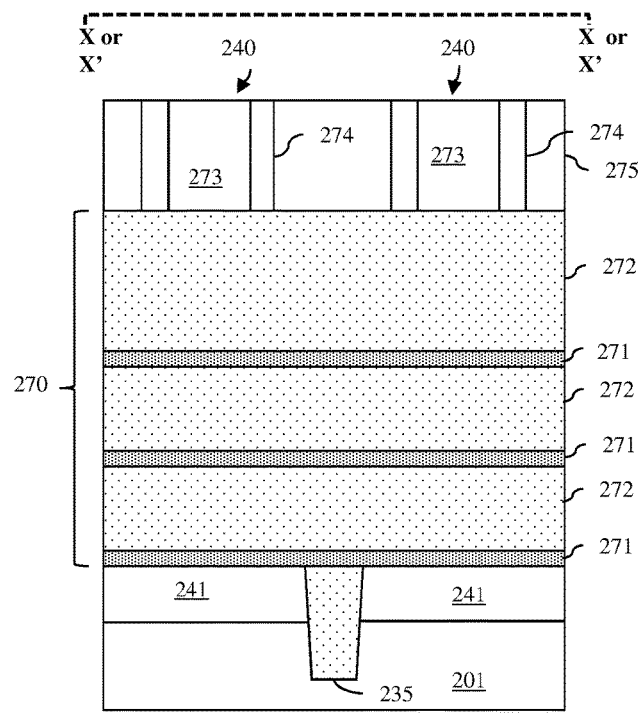
Figure 17C:
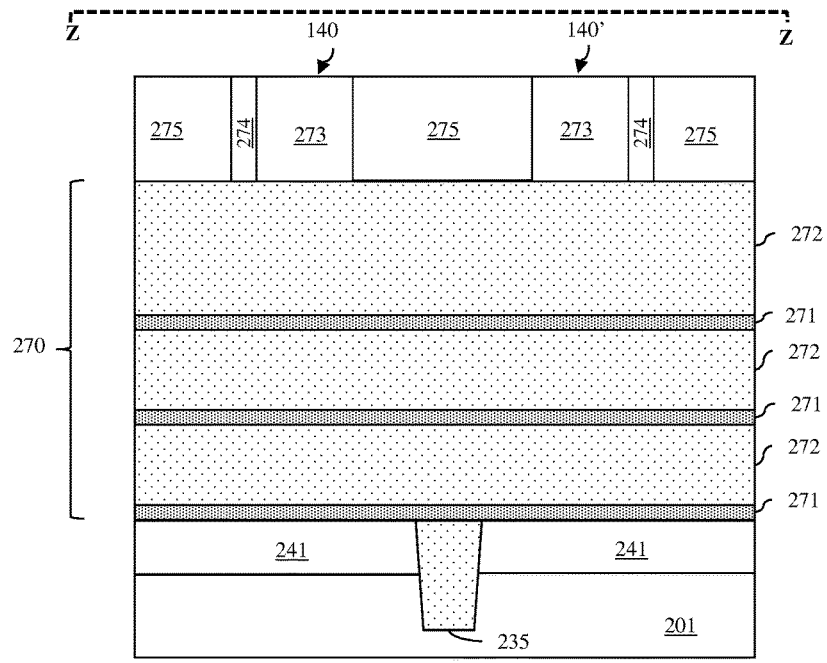
Figure 17D:
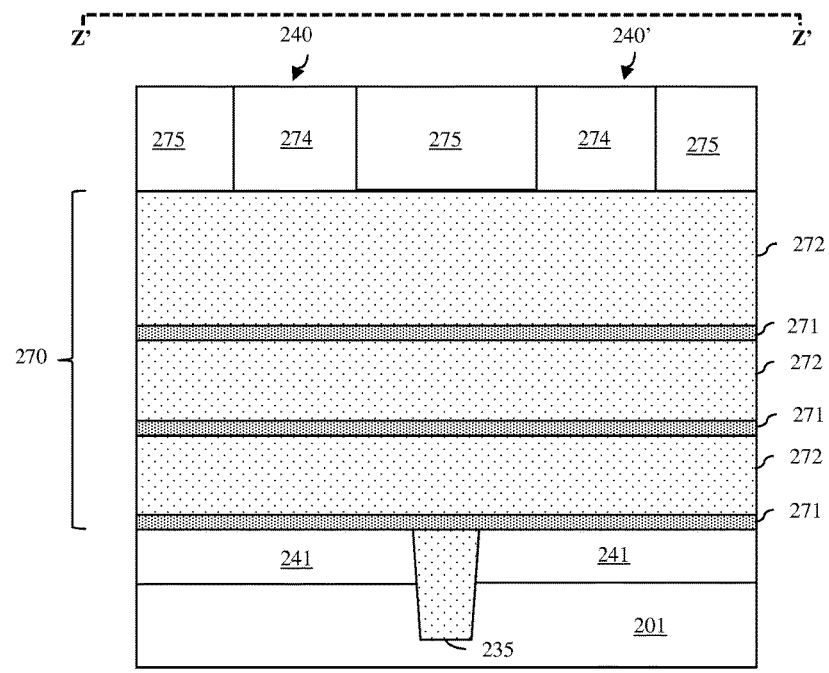

Sacrificial mandrels 273 (e.g., rectangular shaped bodies) can be formed on the stack 270 (see process 410 and FIGS. 16A-16B). That is, mandrel material can be deposited onto the semiconductor substrate and then lithographically patterned and etched. Mandrel sidewall spacers 274 (e.g., silicon nitride sidewall spacers) can then be formed on the mandrels 273, respectively, using conventional sidewall spacer formation techniques (see process 412 and FIGS. 16A-16B). The mandrel and mandrel sidewall spacer materials can be different so as to allow for selective etching during subsequent processing.

Figure 18A:
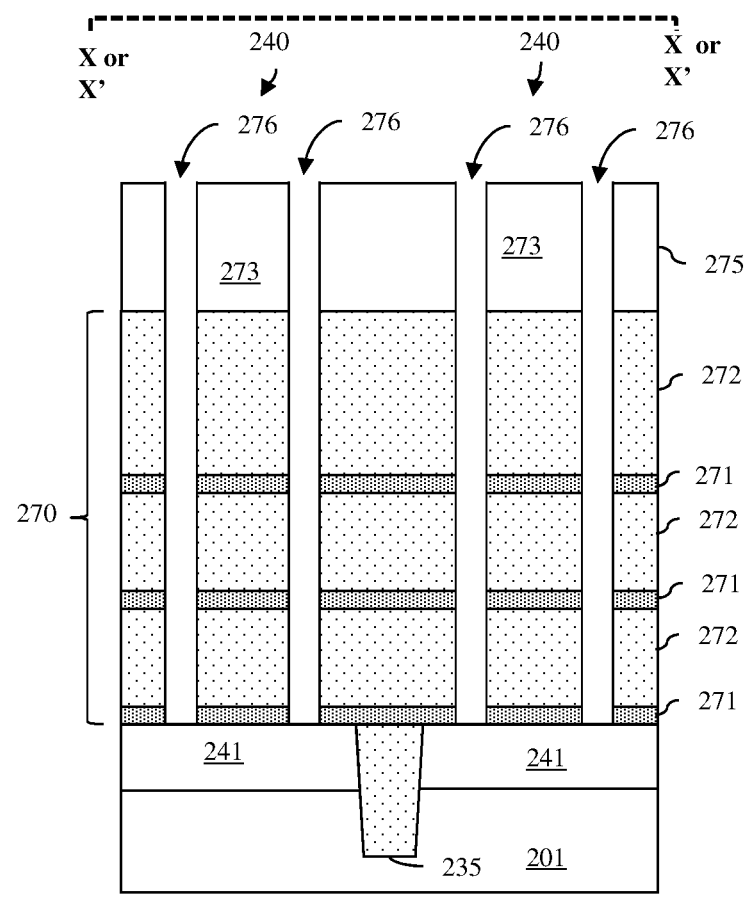
FIGS. 18A-18C are cross-section diagrams illustrating a partially completed structure formed according to the method of FIG. 14.
Figure 18B:
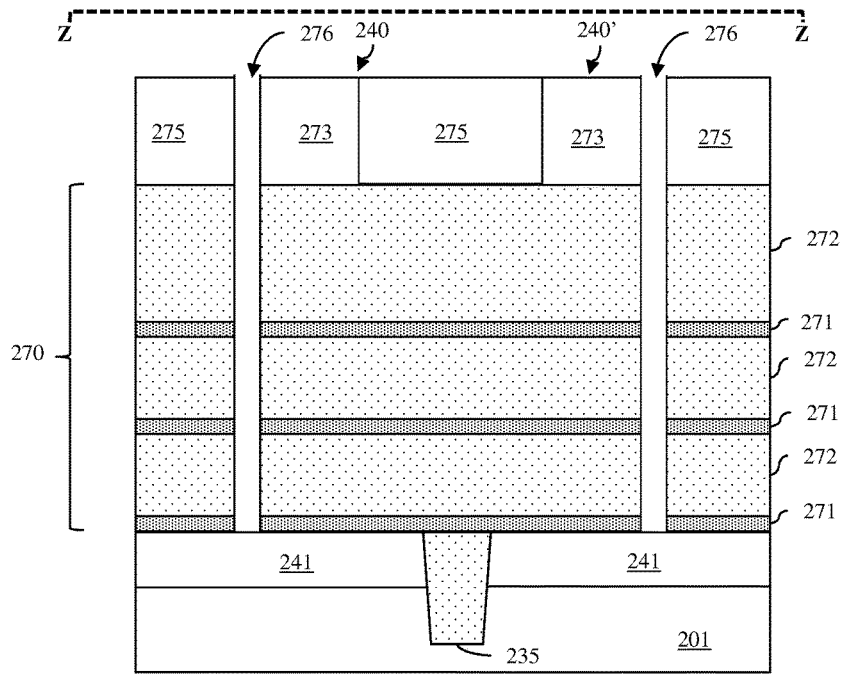
Figure 18C:
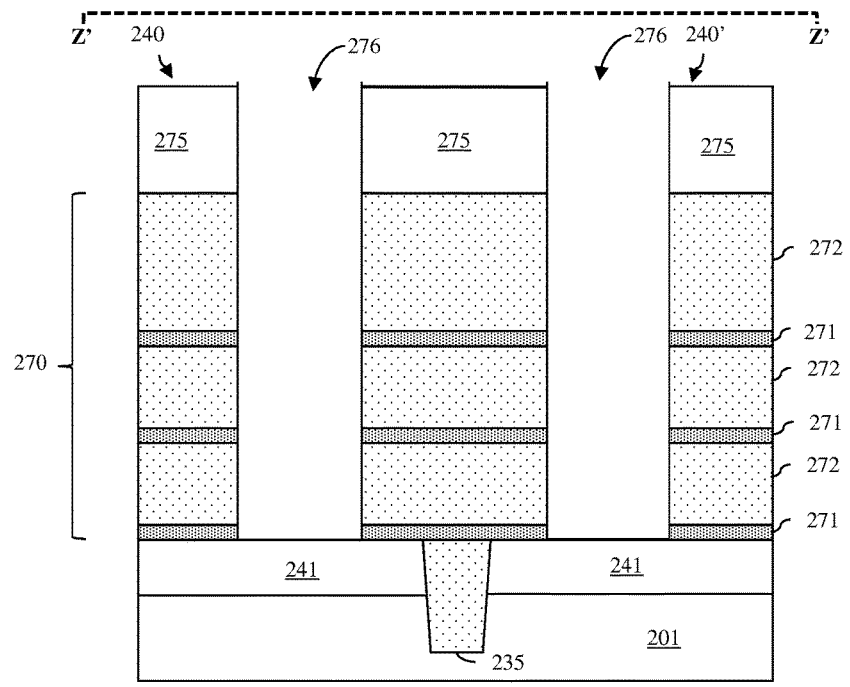

After the mandrel sidewall spacers 274 are formed, a trench can be formed (e.g., patterned and etched) so that it cuts across the mandrel-mandrel sidewall spacer structures, thereby cutting each mandrel-mandrel sidewall spacer structure in two (see process 414). Mandrel material 275 can then be redeposited and a polishing process (e.g., a chemical mechanical polishing (CMP) process) can be performed in order to expose remaining U-shaped sections of each mandrel sidewall spacer 274 (see process 416 and FIGS. 17A-17D). The remaining U-shaped sections of the mandrel sidewall spacers 274 can then be selectively removed to form U-shaped openings 276 within the mandrel material and an anisotropic etch process can be performed in order to extend those U-shaped openings 276 through the stack 270 to the lower source/drain regions 241 (see processes 418-420 and FIGS. 18A-18C). It should be noted that the lower source/drain regions 241 should be formed at process 404 such that when the U-shaped openings 276 are formed, each U-shaped opening lands on a corresponding lower source/drain region 241. The mandrel material 273, 275 can then be selectively removed.

Figure 19A:
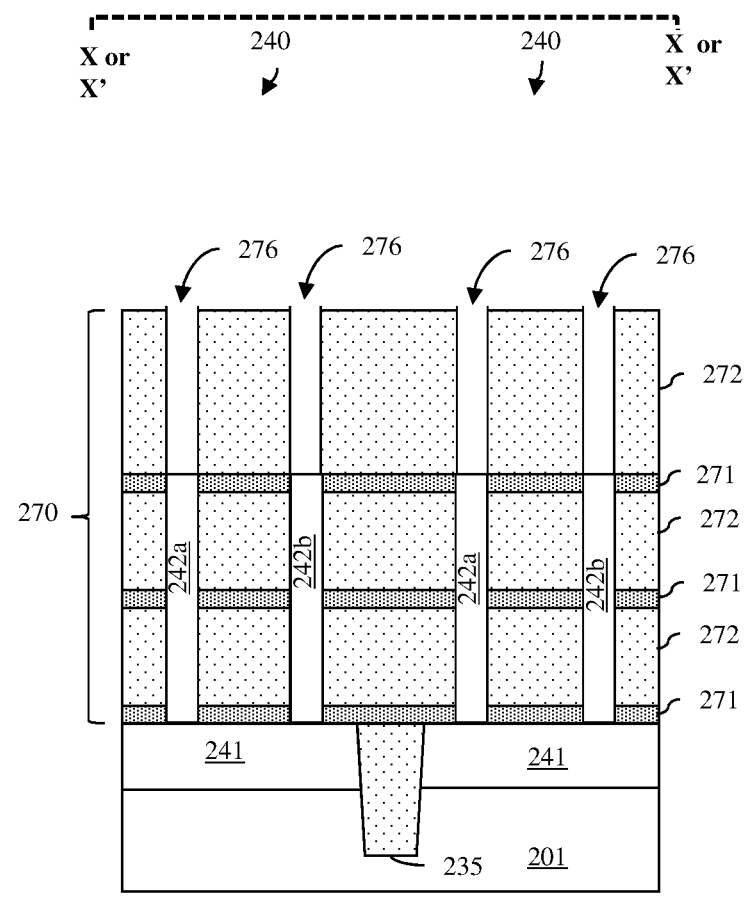
FIGS. 19A-19C are cross-section diagrams illustrating a partially completed structure formed according to the method of FIG. 14.
Figure 19B:
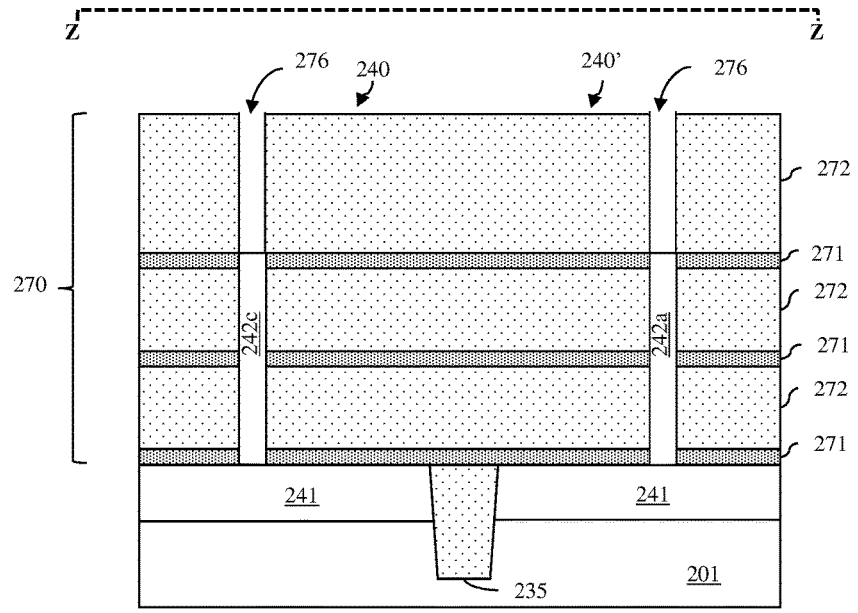
Figure 19C:
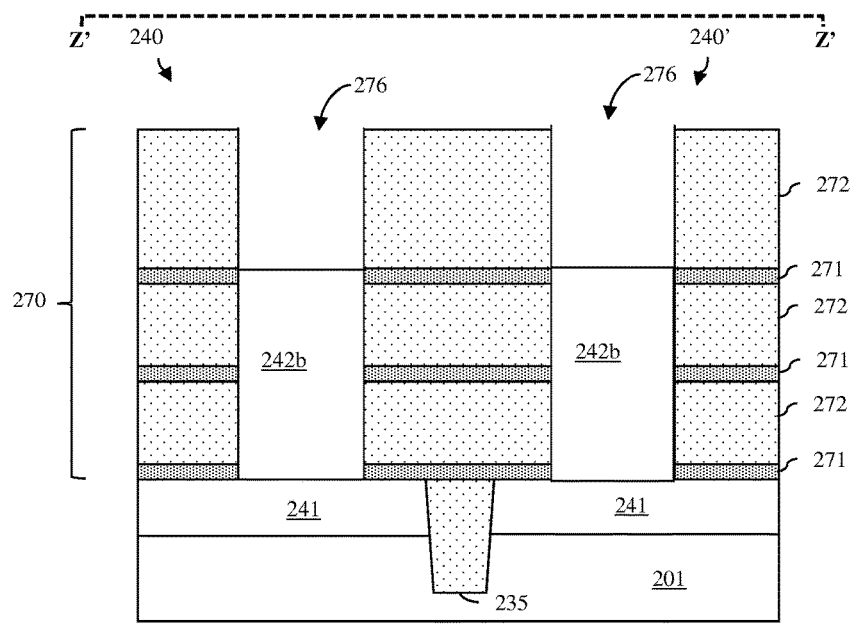

Semiconductor material can then be deposited (e.g., using an epitaxial deposition process) in the U-shaped openings 276 on the top surfaces of the lower source/drain regions 241, thereby forming rows of U-shaped semiconductor bodies 242 (see process 422 and FIGS. 19A-19C). It should be noted that the deposition process should be stopped or, alternatively, an etch back process should be performed so that the tops of the U-shaped semiconductor bodies 242 are approximately level with the top surface of the uppermost layer of the first dielectric material 271 within the stack 270.

Additionally, it should be noted that, as illustrated, a row of mandrels formed at process 410 will result in the formation of two rows of U-shaped openings at process 418 and, thereby two rows of U-shaped semiconductor bodies at process 422. The two rows of U-shaped semiconductor bodies can be used, for example, to form two rows 210, 220 of feedback VFETs separated by a space 230. In any case, each U-shaped semiconductor body 242 formed at process 422 has three segments 242a-242c including two parallel segments 242a-242b and a connecting segment 242c, which extends laterally between adjacent ends of the parallel segments 242a-242b. The parallel segments can be oriented in the Z direction and the connecting segment can be oriented in the X direction. The heights of the three segments 242a-242c, as measured in the Y direction, can be essentially the same such that each semiconductor body 242 is essentially U-shaped (as viewed from above) with a closed end 292 (i.e., the base of the U-shape defined by the connecting segment) and an open end 291 opposite the closed end 292.

Figure 20A:
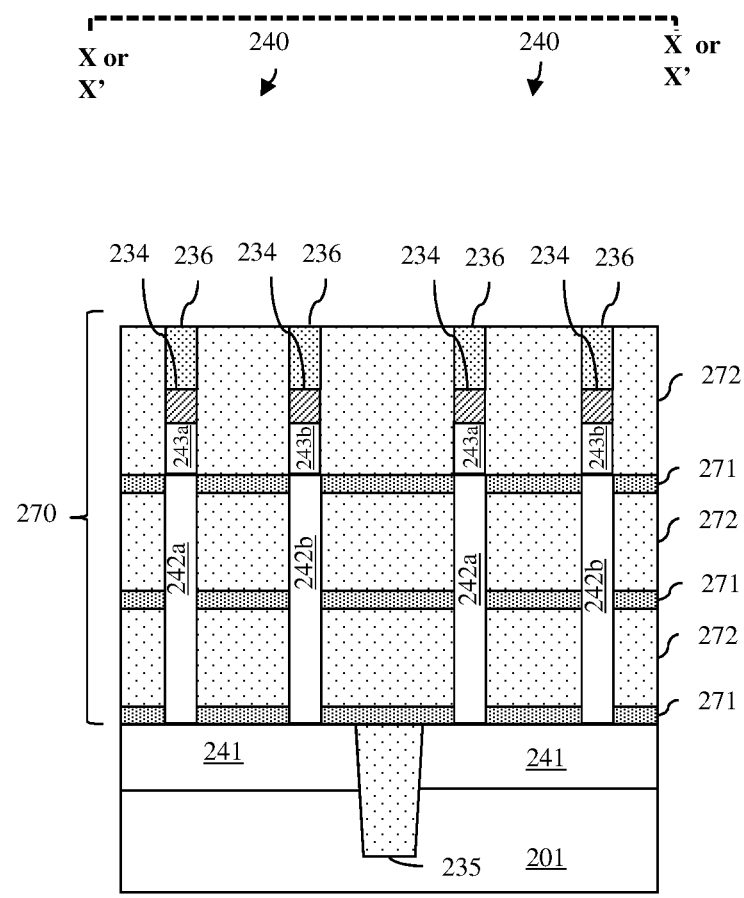
FIGS. 20A-20C are cross-section diagrams illustrating a partially completed structure formed according to the method of FIG. 14.
Figure 20B:
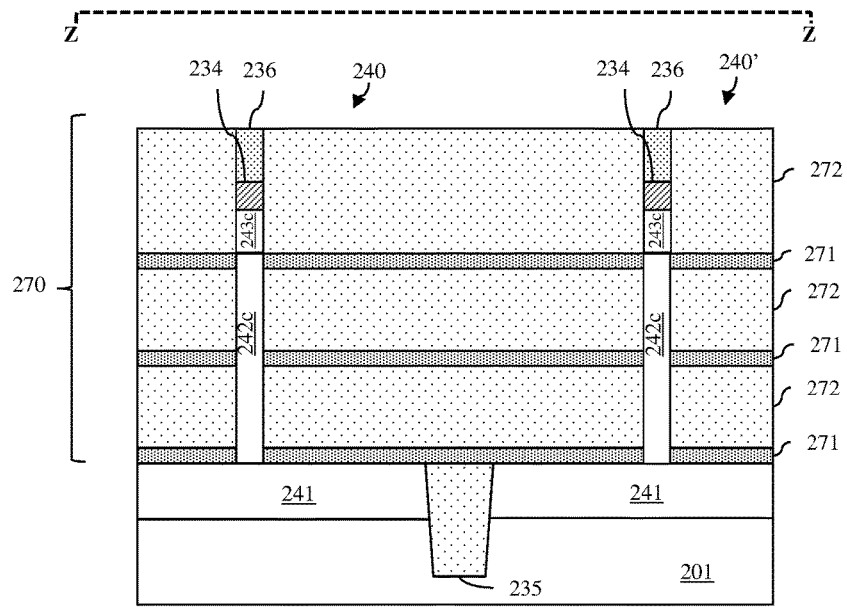
Figure 20C:
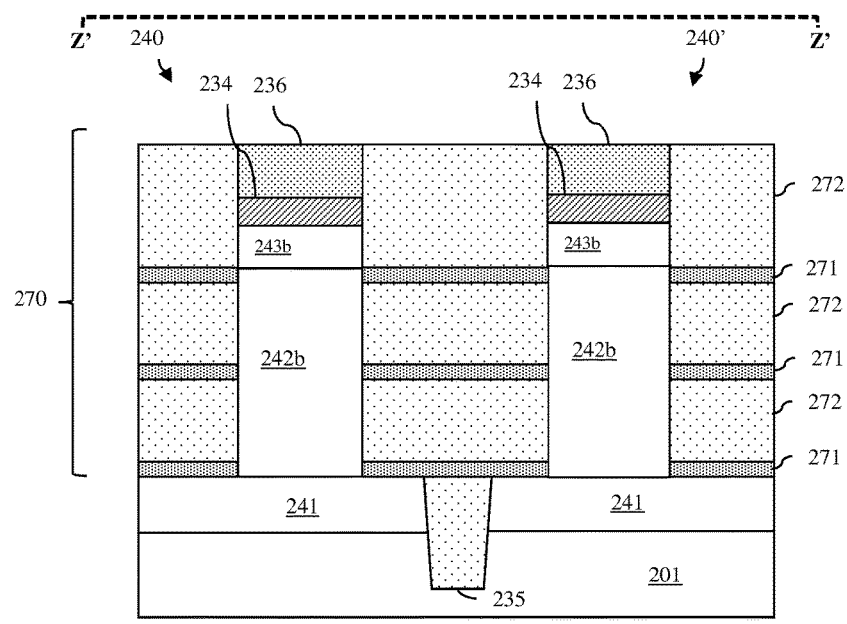

Once the rows of U-shaped semiconductor bodies 242 are formed, upper source/drain regions 243 can be formed within the U-shaped openings 276 on the tops of the U-shaped semiconductor bodies 242, metal plugs 234 can be formed within the U-shaped openings 276 on the tops of the upper source/drain regions 243, and dielectric plug caps 236 can be formed within the U-shaped openings 276 on the tops of the metal plugs 234 (see processes 424-428 and FIGS. 20A-20C). Specifically, an epitaxial semiconductor material can be deposited in the U-shaped openings 276 on the tops of the U-shaped semiconductor bodies 242. This epitaxial semiconductor material can be in situ doped so as to have a second-type conductivity, which is different from the first-type conductivity. Thus, the upper source/drain regions 243 and lower source/drain regions 241 will have different type conductivities. A metal material or metal alloy material (e.g., tungsten, cobalt, aluminum or any other suitable metal plug material) can be deposited into the U-shaped openings 276 on the upper source/drain regions 243 and then recessed to form the metal plugs 234. Then, dielectric material (e.g., silicon nitride or any other suitable dielectric plug cap material) can be deposited to fill the remaining space within the U-shaped openings 276 and a polishing process (e.g., a chemical mechanical polishing (CMP) process) can be performed in order to remove any of the dielectric plug material from above the top surface of the stack 270. Since the components 242, 243, 234 and 236, described above, are all formed within the U-shaped openings, these components will all be essentially U-shaped (as viewed from above).

Figure 21A:
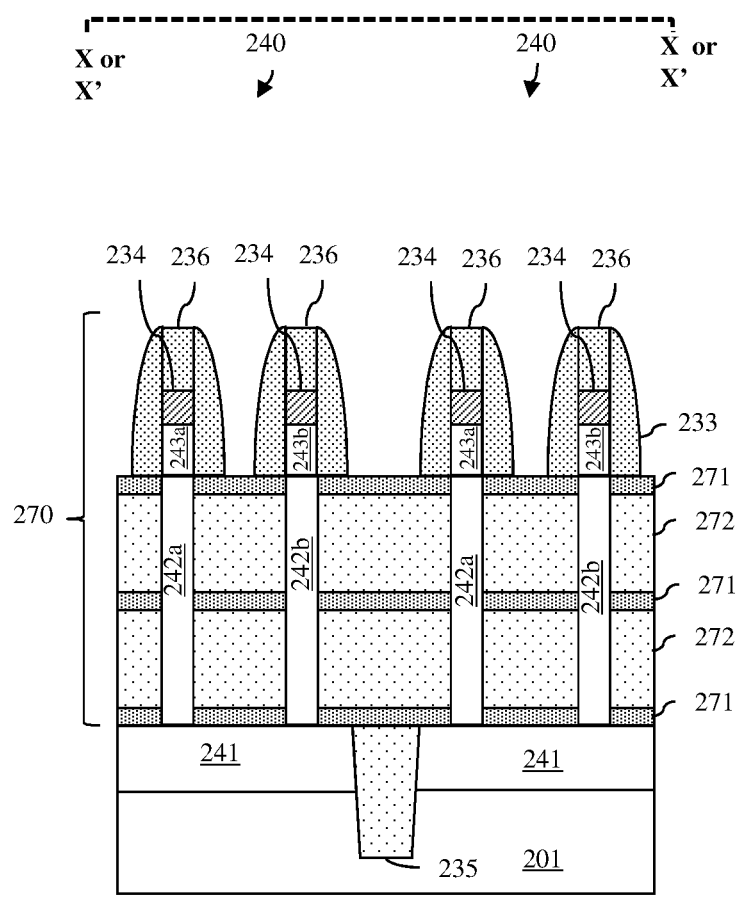
FIGS. 21A-21C are cross-section diagrams illustrating a partially completed structure formed according to the method of FIG. 14.
Figure 21B:
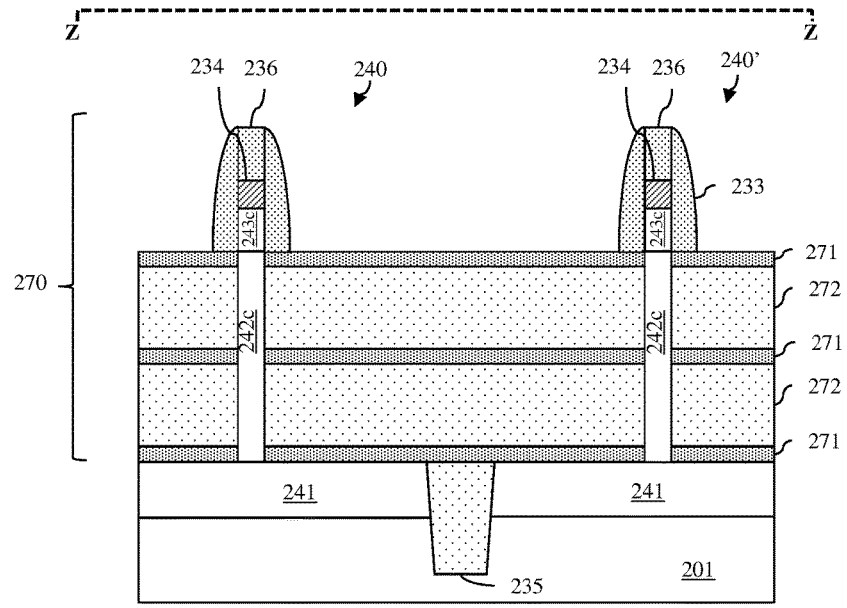
Figure 21C:
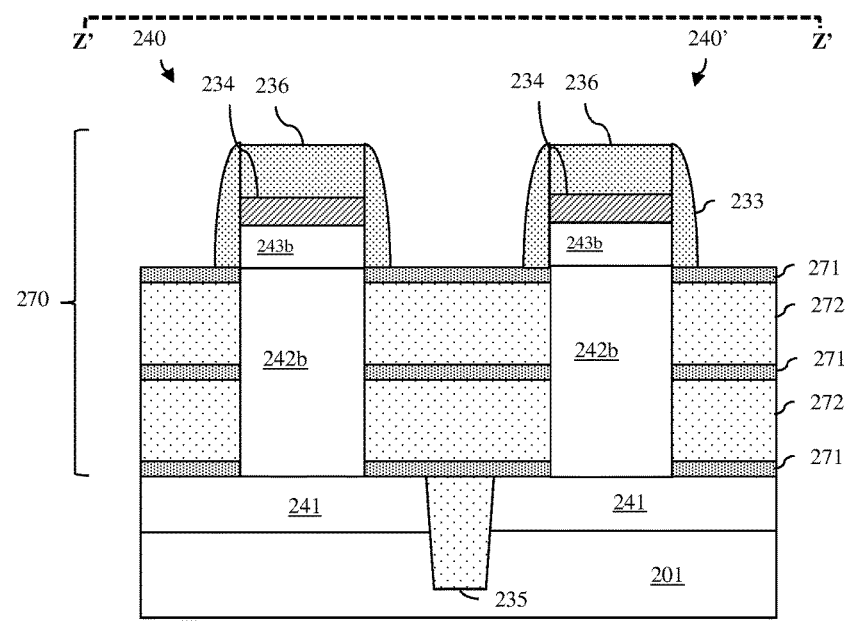

The uppermost layer of the second dielectric material 272 in the stack 270 can then be selectively removed to expose the top surface of the uppermost layer of the first dielectric material 271 as well as the sidewalls of the upper source/drain region 243, the metal plug 234 and the dielectric plug cap 236 above each U-shaped semiconductor body 242 (see process 430). Then, a dielectric sidewall spacer 233 can be formed around the exposed sidewalls (see process 432 and FIGS. 21A-21C). Specifically, a selective isotropic etch process can be used to remove the top layer of the stack 270. Then, dielectric sidewall spacers 233 can be formed (e.g., using conventional sidewall spacer formation techniques) on the exposed sidewalls of the upper source/drain region, metal plug and plug cap above each U-shaped semiconductor body. The dielectric material of the dielectric sidewall spacers 233 can be, for example, silicon nitride or any other suitable dielectric spacer material.

Figure 22A:
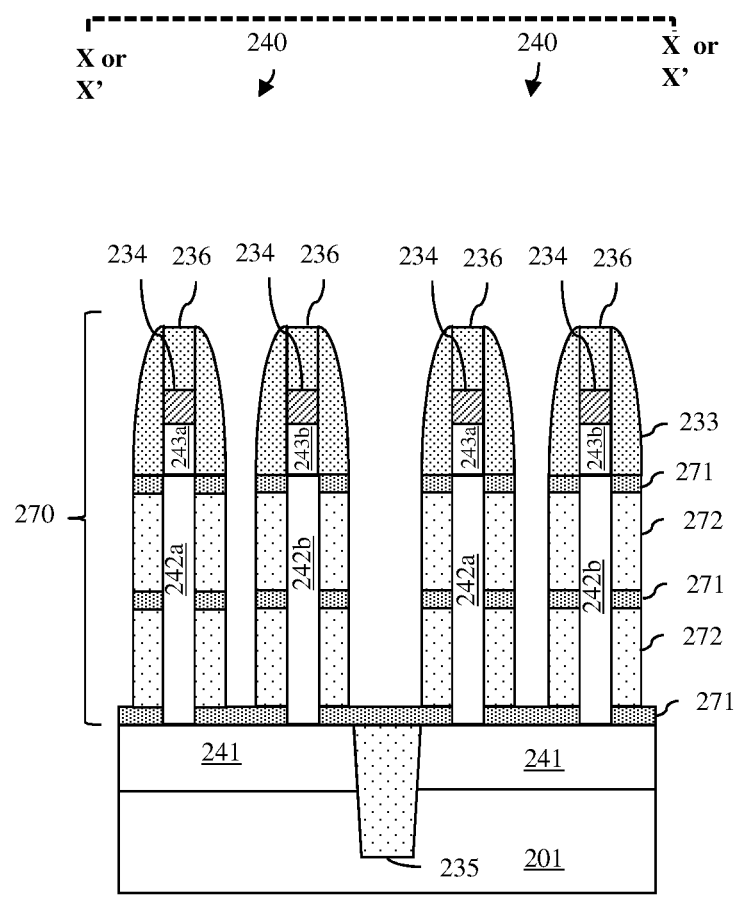
FIGS. 22A-22C are cross-section diagrams illustrating a partially completed structure formed according to the method of FIG. 14.
Figure 22B:
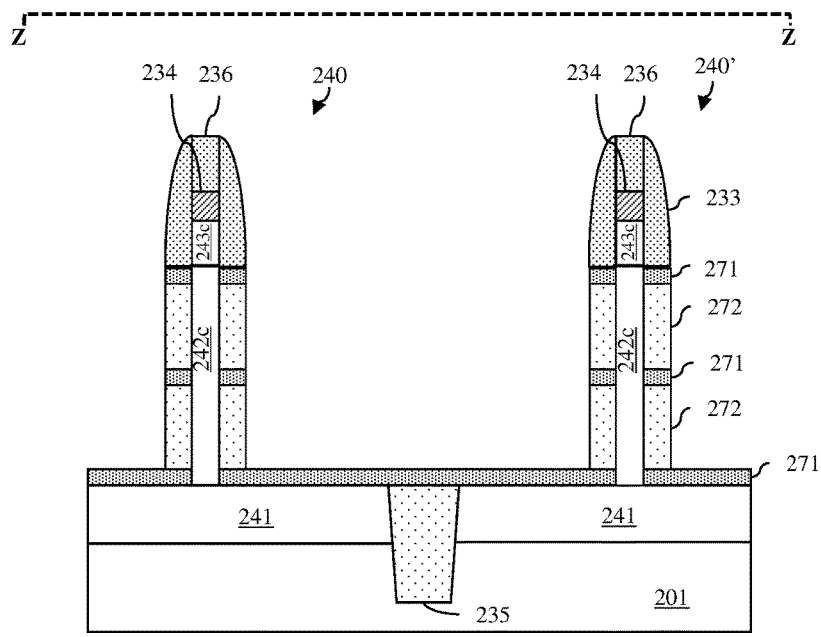
Figure 22C:
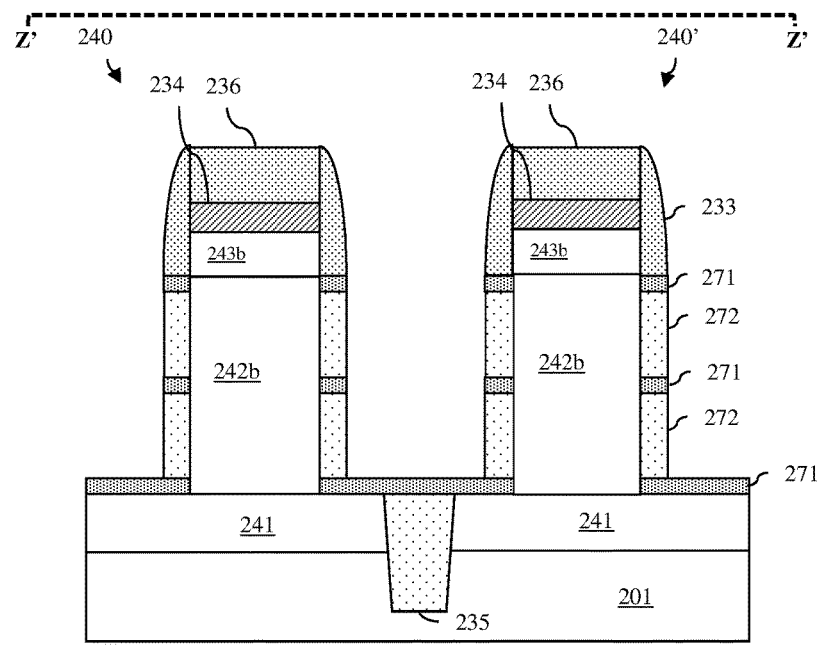

One or more selective anisotropic etch processes can be performed to etch through exposed portions of the stack 270, stopping on the lowermost layer of the first dielectric material 271 (see process 434 and FIGS. 22A-22C). As illustrated, during process 434, the plug cap and adjacent dielectric sidewall spacers above each U-shaped semiconductor body 242 as masks such that portions of the stack 270 remain positioned laterally adjacent to the vertical sidewalls of each U-shaped semiconductor body 242.

Figure 23A:
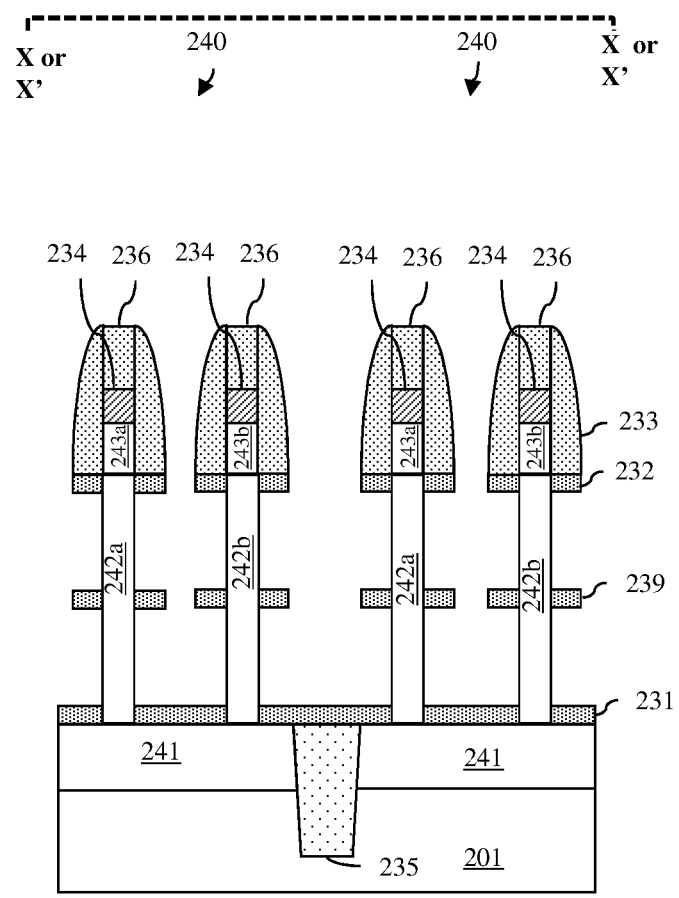
FIGS. 23A-23C are cross-section diagrams illustrating a partially completed structure formed according to the method of FIG. 14.
Figure 23B:
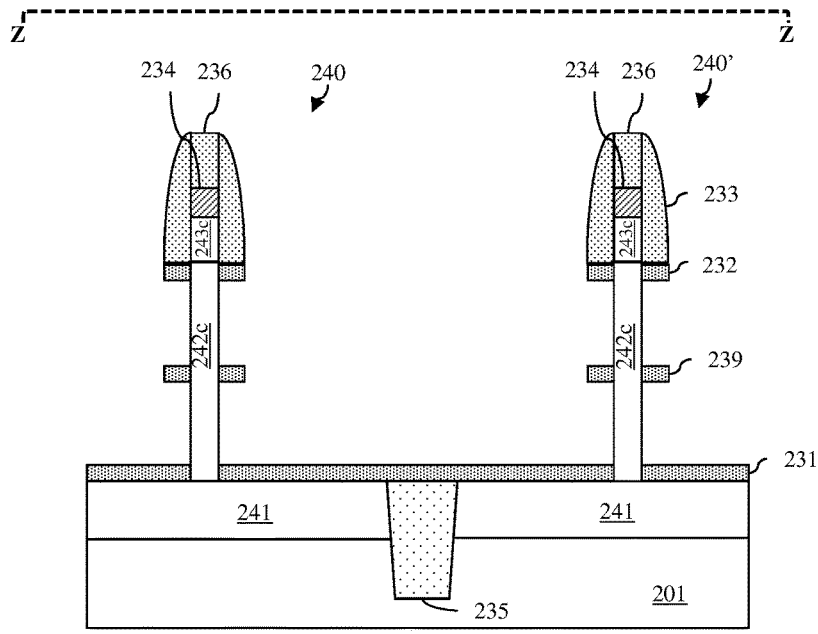
Figure 23C:
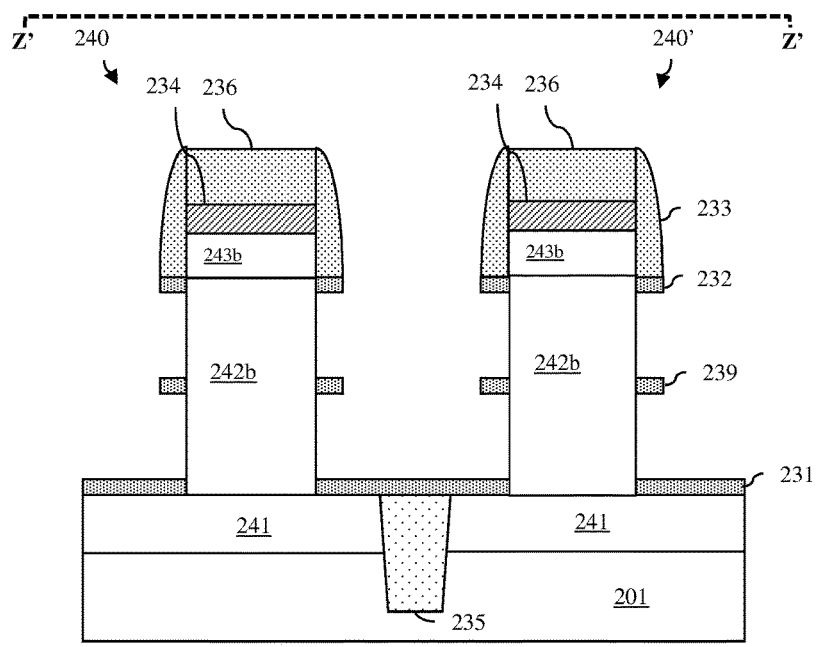

A selective isotropic etch process can then be performed to remove any remaining second dielectric material 272 (see process 436 and FIGS. 23A-23C). As illustrated, following process 436, lower and upper portions of each U-shaped semiconductor body 242 are exposed. Furthermore, the lowermost layer of the first dielectric material remains intact and, thus, forms a lower spacer 231. The remaining portions of the middle layer of the first dielectric material form middle spacers 239, where each middle spacer 239 laterally surrounds the center portions of a corresponding U-shaped semiconductor body 242 between the lower and upper portions. The remaining portions of the uppermost layer of the first dielectric material form upper spacers 232, where each upper spacer 232 laterally surrounds the top end of a corresponding U-shaped semiconductor body 242 between the upper portion and the upper source/drain regions 243.

Figure 24A:
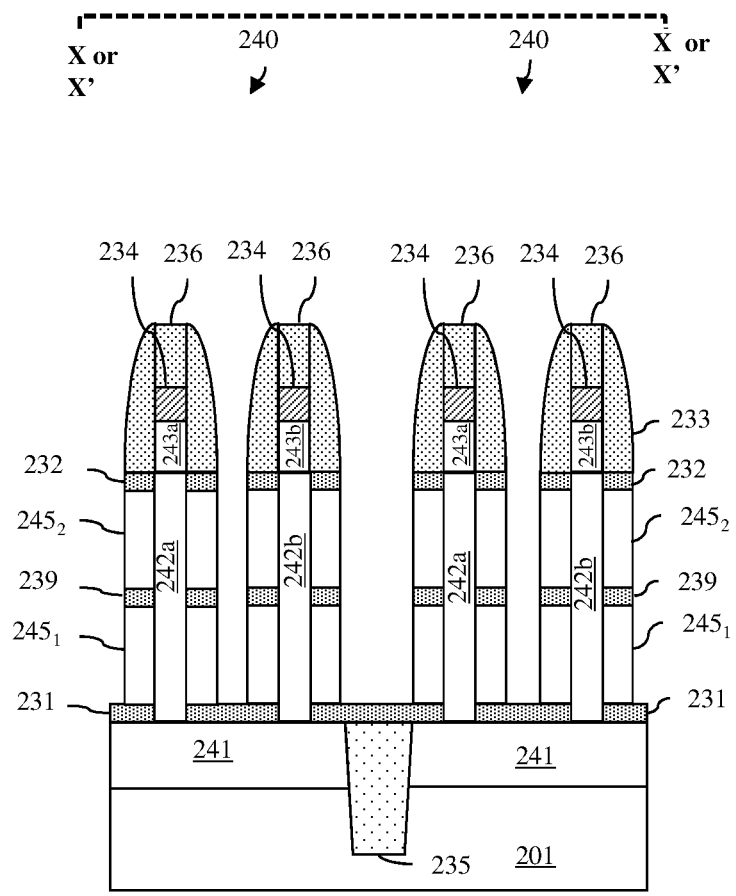
FIGS. 24A-24C are cross-section diagrams illustrating a partially completed structure formed according to the method of FIG. 14.
Figure 24B:
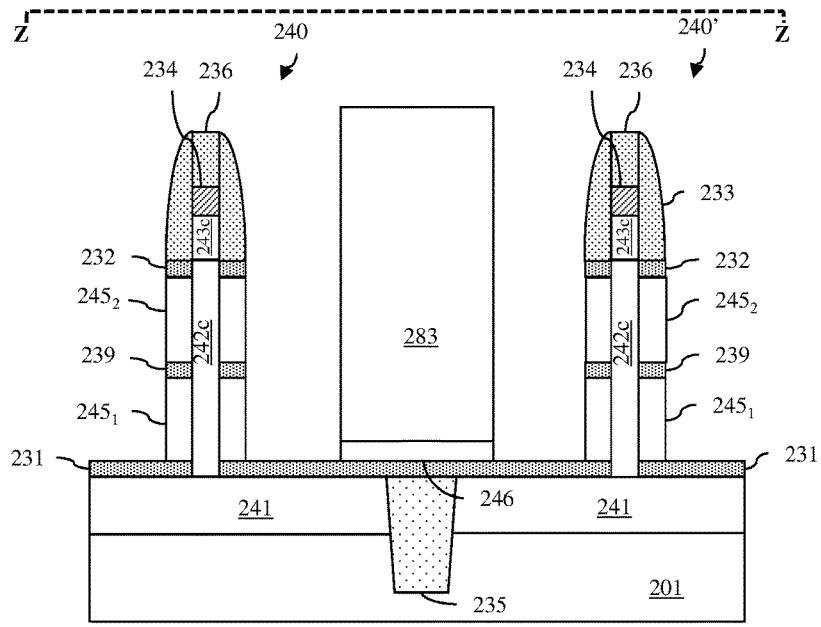
Figure 24C:
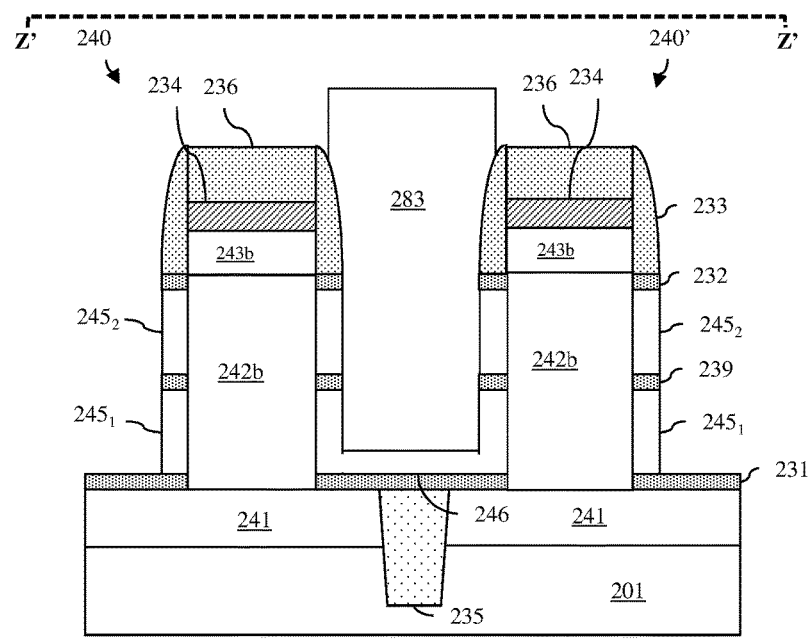

After the second dielectric material 272 is etched away, gate materials can be conformally deposited over the partially completed structure (see process 438). The gate materials can include a gate dielectric layer (e.g., a high-K gate dielectric layer) and a gate conductor layer on the gate dielectric layer. Additionally, gate extension masks 283 can be formed on the gate materials (e.g., in the space 230 between each pairs of U-shaped semiconductor bodies 242) (see process 440). Then, an anisotropic etch process can be performed to form first gate structures $245_1$, second gate structures $245_2$ and gate extensions 246 (see process 442 and FIGS. 24A-24C). Specifically, during this anisotropic etch process, the plug cap and adjacent dielectric sidewall spacers above each U-shaped semiconductor body 242 function as gate masks. As a result, a first gate structure $245_1$ and a second gate structure $245_2$ are formed so as to laterally surround a lower portion and an upper portion, respectively, of each U-shaped semiconductor body 242. The first gate structure $245_1$ is stacked between the lower spacer 231 and the middle spacer 239. The second gate structure $245_2$ is stacked between the middle spacer 239 and the upper spacer 232. Thus, the first gate structure $245_1$ is electrically isolated from the lower source/drain region 241 by the lower spacer 231 and from the second gate structure $245_2$ by the middle spacer 239. The gate extension mask is further formed so that following this anisotropic etch process, each first gate structure $245_1$ is in contact with a gate extension that extends laterally into the space 230.

Additional processing can then be performed in order to complete the feedback VFETs 240, 240' in the semiconductor structure 200 (see process 444 and FIGS. 2A-2F). The additional processing can include deposition of ILD material 238 (e.g., silicon dioxide or any other suitable ILD material) as well as the formation of contacts that extend through the ILD material 238 to the various VFET nodes. For each feedback VFET 240, 240', these contacts can include a lower source/drain contact 251, which is formed such that it is adjacent to the closed end 292 of the U-shaped semiconductor body 242 and such that it extends vertically through the ILD material 238 to an edge portion of the lower source/drain region 241. These contacts can further include an upper source/drain contact 252, which is formed such that it extends vertically through the ILD material 238 and the dielectric plug cap 236 and lands on the metal plug 234. These contacts can further include a gate extension contact 254 and a gate contact 253. The gate extension contact 254 can be formed so that it extends vertically through the ILD material 238 and lands on a horizontal surface of the gate extension 246 so as to provide an electrical connection to the first gate structure $245_1$. The gate contact 253 can be formed so that it extends vertically between the parallel segments 242a-242b of the U-shaped semiconductor body (e.g., near the open end 291), so that it lands on ILD material 238 above the level of the middle spacer 239 and so that it has opposing vertical surfaces that are in contact with vertical surfaces of the portions of the second gate structure $245_2$ on the upper portions of parallel segments of the U-shaped semiconductor body, respectively. Such a gate contact 253 will be electrically isolated from the first gate structure $245_1$ by the middle spacer 239 and ILD material 238 and from the upper source/drain region 243 by the dielectric plug cap 236 and the dielectric sidewall spacer 233. Techniques for forming contacts are well known in the art and, thus, the details of those techniques have been omitted from this specification in order to allow the reader to focus on the salient aspects of the disclosed embodiments. As discussed above, contact placement, particularly, with respect to the various VFETs in a VFET cell can be optimized to avoid critical design rule violations and allow for cell size scaling.

In the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and gallium nitride-based semiconductor materials. A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity or silicon (Si) to achieve N-type conductivity. Those skilled in the art will also recognize that different conductivity levels will depend upon the relative concentration levels of the dopant(s) in a given semiconductor region.

Additionally, in the methods and structures described above, the materials and thicknesses of the gate materials used for the gate structures can be preselected to achieve desired work functions depending upon whether the FETs are PFETs, NFETs or feedback FETs, which are capable of functioning as either PFETs or NFETs. Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The optimal work function for a gate conductor of an NFET will be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal work function for a gate conductor of a PFET will be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.).

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a substrate; and
   a vertical field effect transistor comprising:
      a lower source/drain region on the substrate;
      a semiconductor body having three segments comprising:
         parallel segments above and immediately adjacent to the lower source/drain region and oriented in a first direction across the lower source/drain region; and
         a connecting segment above and immediately adjacent to the lower source/drain region and oriented in a second direction across the lower source/drain region, wherein the connecting segment extends laterally between and is in direct contact with adjacent ends of the parallel segments such that the semiconductor body is essentially U-shaped, wherein the three segments have essentially equal heights; and
      a single upper source/drain region on the three segments of the semiconductor body.

2. The semiconductor structure of claim 1,
   wherein the lower source/drain region and the upper source/drain region have a same type conductivity, and
   wherein the vertical field effect transistor further comprises:
      a gate structure positioned laterally adjacent to sidewalls of the three segments of the semiconductor body so as to define a single channel region within the three segments of the semiconductor body;
      a lower spacer electrically isolating the gate structure from the lower source/drain region;
      an upper spacer electrically isolating the gate structure from the upper source/drain region; and
      a dielectric sidewall spacer positioned laterally immediately adjacent to the upper source/drain region and further above and immediately adjacent to the upper spacer, wherein the dielectric sidewall spacer, the upper spacer, and the gate structure have essentially aligned vertical surfaces.

3. The semiconductor structure of claim 2,
   wherein the vertical field effect transistor further comprises a gate contact between the parallel segments and having opposing sides contacting adjacent vertical surfaces, respectively, of the gate structure,
   wherein the gate contact is electrically isolated from the lower source/drain region by the lower spacer and is electrically isolated from the upper source/drain region by the dielectric sidewall spacer.

4. The semiconductor structure of claim 2, wherein the vertical field effect transistor further comprises:
   a gate extension in contact with the gate structure; and
   a gate extension contact on the gate extension.

5. The semiconductor structure of claim 1,
   wherein the lower source/drain region has a first-type conductivity,
   wherein the upper source/drain region has a second-type conductivity that is different than the first-type conductivity, and
   wherein the vertical field effect transistor further comprises:
      a first gate structure laterally surrounding a lower portion of the three segments of the semiconductor body;
      a second gate structure laterally surrounding an upper portion of the three segments of the semiconductor body;
      a lower spacer electrically isolating the first gate structure from the lower source/drain region;
      a middle spacer electrically isolating the first gate structure from the second gate structure; and
      an upper spacer electrically isolating the second gate structure from the upper source/drain region.

6. The semiconductor structure of claim 5, wherein the vertical field effect transistor further comprises:
   a gate extension in contact with the first gate structure; and
   a gate extension contact on the gate extension.

7. The semiconductor structure of claim 5, wherein the vertical field effect transistor further comprises a gate contact between the parallel segments above a level of the middle spacer and contacting the second gate structure.

8. The semiconductor structure of claim 1, further comprising multiple vertical field effect transistors in adjacent rows separated by a space,
   wherein all semiconductor bodies of the vertical field effect transistors in a given row are essentially U-shaped and have open ends adjacent to the space, and
   wherein the semiconductor bodies of each pair of vertical field effect transistors on opposite sides of the space have aligned parallel segments.

9. A semiconductor structure comprising:
   a substrate; and
   a vertical field effect transistor comprising:
      a lower source/drain region on the substrate;
      a semiconductor body comprising:
         parallel segments above and immediately adjacent to the lower source/drain region; and
         a connecting segment above and immediately adjacent to the lower source/drain region and extending laterally between adjacent ends of the parallel segments, wherein the parallel segments and the connecting segment have essentially equal heights; and
      an upper source/drain region on the semiconductor body,
   wherein the lower source/drain region and the upper source/drain region have a same type conductivity,
   wherein the vertical field effect transistor further comprises:
      a gate structure positioned laterally adjacent to sidewalls of the semiconductor body so as to define a channel region within the semiconductor body;

a lower spacer electrically isolating the gate structure from the lower source/drain region;

an upper spacer electrically isolating the gate structure from the upper source/drain region;

a dielectric sidewall spacer on the upper source/drain region above the upper spacer;

a gate extension in contact with the gate structure; and a gate extension contact on the gate extension.

10. The semiconductor structure of claim 9, wherein the gate extension and the gate structure comprise continuous portions of patterned gate material.

11. The semiconductor structure of claim 9, wherein the vertical field effect transistor further comprises:

a metal plug above and immediately adjacent to the upper source/drain region; and dielectric plug cap above and immediately adjacent to the metal plug, wherein the dielectric sidewall spacer is positioned laterally immediately adjacent to opposing sidewalls of the upper source/drain region, the metal plug and the dielectric plug cap.

12. The semiconductor structure of claim 11, wherein the vertical field effect transistor further comprises an upper source/drain region contact that extends through interlayer dielectric material to the dielectric plug cap and further extends through the dielectric plug cap to the metal plug.

13. The semiconductor structure of claim 12, wherein the upper source/drain contact has an upper portion within the interlayer dielectric material above and traversing the parallel segments of the semiconductor body and lower portions that extend through the dielectric plug cap to the metal plug above the parallel segments, respectively.

14. The semiconductor structure of claim 9, further comprising multiple vertical field effect transistors in adjacent rows separated by a space, wherein all semiconductor bodies of the vertical field effect transistors in a given row have open ends adjacent to the space, and wherein the semiconductor bodies of each pair of vertical field effect transistors on opposite sides of the space have aligned parallel segments.

15. A semiconductor structure comprising:

a substrate; and a vertical field effect transistor comprising:

a lower source/drain region on the substrate;

a semiconductor body comprising:

parallel segments above and immediately adjacent to the lower source/drain region; and a connecting segment above and immediately adjacent to the lower source/drain region and extending laterally between adjacent ends of the parallel segments, wherein the parallel segments and the connecting segment have essentially equal heights; and an upper source/drain region on the semiconductor body, wherein the lower source/drain region has a first-type conductivity, wherein the upper source/drain region has a second-type conductivity that is different than the first-type conductivity, and wherein the vertical field effect transistor further comprises:

a first gate structure laterally surrounding a lower portion of the semiconductor body;

a second gate structure laterally surrounding an upper portion of the semiconductor body;

a lower spacer electrically isolating the first gate structure from the lower source/drain region;

a middle spacer electrically isolating the first gate structure from the second gate structure; and an upper spacer electrically isolating the second gate structure from the upper source/drain region.

16. The semiconductor structure of claim 15, wherein the vertical field effect transistor further comprises:

a gate extension in contact with the first gate structure; and a gate extension contact on the gate extension.

17. The semiconductor structure of claim 15, wherein the vertical field effect transistor further comprises a gate contact between the parallel segments above a level of the middle spacer and contacting the second gate structure.

18. The semiconductor structure of claim 15, wherein the vertical field effect transistor further comprises:

a metal plug above and immediately adjacent to the upper source/drain region;

dielectric plug cap above and immediately adjacent to the metal plug;

a dielectric sidewall spacer above the upper spacer and positioned laterally immediately adjacent to opposing sidewalls of the upper source/drain region, the metal plug and the dielectric plug cap; and an upper source/drain region contact that extends through interlayer dielectric material and the dielectric plug cap to the metal plug.

19. The semiconductor structure of claim 18, wherein the upper source/drain contact has an upper portion within the interlayer dielectric material above and traversing the parallel segments of the semiconductor body and lower portions that extend through the dielectric plug cap to the metal plug above the parallel segments, respectively, and wherein the lower portions are physically separated by the interlayer dielectric material.

20. The semiconductor structure of claim 15, further comprising multiple vertical field effect transistors in adjacent rows separated by a space, wherein all semiconductor bodies of the vertical field effect transistors in a given row have open ends adjacent to the space, and wherein the semiconductor bodies of each pair of vertical field effect transistors on opposite sides of the space have aligned parallel segments.

* * * * *